United States Patent
Hattori et al.

(10) Patent No.: US 6,453,439 B1
(45) Date of Patent: Sep. 17, 2002

(54) PSEUDO PRODUCT CODE ENCODING AND DECODING APPARATUS AND METHOD

(75) Inventors: Masayuki Hattori, Kanagawa; Kohei Yamamoto, Tokyo, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/501,613

(22) Filed: Feb. 10, 2000

(30) Foreign Application Priority Data

Feb. 12, 1999 (JP) ............................................. 11-034732

(51) Int. Cl.[7] ............................................. H03M 13/00

(52) U.S. Cl. ....................................................... 714/755

(58) Field of Search ................................ 714/752, 755, 714/763, 758

(56) References Cited

U.S. PATENT DOCUMENTS

| | | | | |
|---|---|---|---|---|
| 4,680,764 A | * | 7/1987 | Suzuli et al. | 714/756 |
| 4,802,173 A | | 1/1989 | Baggen | 714/755 |
| 4,856,003 A | * | 8/1989 | Weng | 714/784 |
| 5,568,494 A | * | 10/1996 | Zwaans | 714/763 |

FOREIGN PATENT DOCUMENTS

| | | |
|---|---|---|
| EP | 0 603 932 | 6/1994 |
| EP | 0 689 208 | 12/1995 |

OTHER PUBLICATIONS

Meyer C.: 'Error Correction Implementation and Performance in a CD–ROM Drive', 1266 Hewlett–Packard Journal, Palo Alto, CA, US, Dec. 1990, vol. 41, No. 6, pp. 42 to 48, XP178549.

Seung Ho Kim et al: "Decoding Strategies for Reed–Solomon Product Codes: Application to Digital Video Recording Systems" IEEE Transactions on Consumer Electronics, US, IEEE Inc. New York, vol. 38, No. 3, Aug. 1, 1992, pp. 243–246, XP000311844.

Bate S D et al: "Error Control Techniques Applicable to HF Channels" IEE Proceedings I. Solid–State & Electron Devices, GB, Institution of Electrical Engineers. Stevenage, vol. 136, No. 1, Part 1, Feb. 1, 1989, pp. 57–63, XP00047678.

* cited by examiner

Primary Examiner—Phung M. Chung
Assistant Examiner—Shelly A Chase
(74) Attorney, Agent, or Firm—Frommer Lawrence & Haug LLP; William S. Frommer

(57) ABSTRACT

A pseudo product code decoder effects error correction by using parity symbols of a first linear-structure error correction code contained in an input symbol train that constitutes a pseudo product code and by using parity symbols of a second linear-structure error correction code. Second-series information symbols are extracted from the symbol train; and a subtraction code of a pseudo product code codeword is formed of the second-series information symbols, with the first-series information symbol portion and the second linear-structure error correction code portion being changed to zero codes. The pseudo product code codeword is transformed into a product code codeword by subtracting processing with the subtraction code. Decoding processing is performed a plurality of times on the symbol train of the product code codeword, thereby effecting error correction; and first-series information symbols are extracted from the error corrected symbol train.

12 Claims, 18 Drawing Sheets

○ 1ST SERIES INFORMATION SYMBOL
⊙ 2ND SERIES INFORMATION SYMBOL
⊘ C1 CODE PARITY SYMBOL
⊘ C2 CODE PARITY SYMBOL

⊙ 2ND SERIES INFORMATION SYMBOL
⊛ C1 CODE PARITY SYMBOL

○ 1ST SERIES INFORMATION SYMBOL
⊛ SHORTENED-C1-CODE PARITY SYMBOL
⊘ C2 CODE PARITY SYMBOL
⊗ SHORTENED-C1-CODE / C2 CODE PARITY SYMBOL

× ERROR SYMBOL
○ 1ST SERIES INFORMATION SYMBOL
⊙ 2ND SERIES INFORMATION SYMBOL
⊗ C1 CODE PARITY SYMBOL
⊘ C2 CODE PARITY SYMBOL

PSEUDO PRODUCT CODE ENCODING AND DECODING APPARATUS AND METHOD

BACKGROUND OF THE INVENTION

1. Field of the Invention

The present invention relates to apparatus and method for encoding and decoding pseudo product code, suitable for use in digital devices which use pseudo product codes, such as a digital video tape recorder, digital audio recorder, digital communication device, or the like. More particularly, the present invention is concerned with a pseudo-product code encoding and decoding apparatus and method in which decoding processing is performed after a conversion of a pseudo-product code into a product code, so as to improve error correction capability.

2. Description of the Related Art

Recording/playback apparatuses such as digital video tape recorders and digital audio recorders, which digitize input video signals and audio signals and record the resultant digital signals, are put into use in recent years.

Referring to FIG. 15, a typical known recording/playback apparatus of the kind mentioned above, denoted by 200, has a video signal code encoding unit 201 which, upon receipt of a video signal, encodes the video signal to form video data. The video data is delivered to an error correction code encoding unit 202 which performs an error-correction encoding on the video data. The video data output from the error correction code encoding unit 202 is supplied to a recording/playback unit 203 in which the video data is recorded in a magnetic tape 206 by means of a rotary head 207.

In playback mode of operation of the recording/playback apparatus 200, video data recorded in the magnetic tape 206 is reproduced by a rotary head 207. The video data thus reproduced in the recording/playback unit 203 is subjected to an error-correction processing performed by an error correction code decoding unit 204. The video data after the error correction is then output as video signals through a video signal decoding unit 205.

Various types of codes are usable as the error correction code to be processed in the error correction code encoding unit 202 and the error correction code decoding unit 204. One example of such error-correction codes is a product code which has linear-structure error-correction codes arranged both in column and line directions of a rectangular matrix of information symbols. For instance, a product code codeword as shown in FIG. 16 is known. The product code codeword shown in FIG. 16 has a C1 codes (referred to also as "internal code") which are consecutive in the direction of the magnetic tape 206, and C2 codes (referred to also as "external code") which are arranged in a direction perpendicular to the direction of arrangement of the C1 codes.

In the example of the product code codeword shown in FIG. 16, the C1 code is a linear-structure error correction code which has a code length of 10 symbols and a parity number of 4 symbols and which is capable of effecting correction of up to 2 symbols at the maximum. Likewise, each C2 code is a linear-structure error correction code which has a code length of 14 symbols and a parity number of 14 symbols and which is capable of effecting correction of up to 2 symbols at the maximum. Thus, the product code codeword is composed of elementary linear-structure error-correction codes. The sequence of encoding may be such that C1 codes are encoded first followed by encoding of the C2 codes or vice versa. It is known that the same encoding result is obtained regardless of the sequence of encoding.

It is assumed here that the C2 codes are encoded first, and then the encoding of the C1 codes is performed. In such a case, based on the definition, a symbol group 212 is a group of parity symbols of the C1 codes. Obviously, a symbol group 213 shown in FIG. 16 is a group of parity symbols of the C1 codes, added to the parity symbols of the C2 codes. Since identical encoding results are obtained regardless of the sequence of encoding as stated before, the symbol group 213 shown in FIG. 16 also is a group of parity symbols of the C2 codes added to the parity symbols of the C1 codes. Thus, even when the encoding sequence is such that the encoding of the C1 codes is performed subsequent to the encoding of the C2 codes, not only the symbol group 211 but also the symbol group 212 are regarded as being C2 codes, when the matrix of the symbols is viewed in the columnar direction.

It has been known that error correction ability for correcting error of a product code can be enhanced by repeating decoding a plurality of times, by making use of the above-described characteristic of parity symbols of the product code. For instance, when decoding processing is repeated such that a decoding processing of the C1 codes in the line direction is effected first and then a decoding processing of the C2 codes is performed in the columnar direction, errors that remain not corrected through the decoding of the C1 codes may be corrected in the course of the decoding processing of the C2 codes. Further repetition of the decoding processings such as decoding processing of C1 code, decoding processing of C2 code, and so on, serves to enhance the error correction ability without fail.

Pseudo product code, which can store two series of information symbols, is also known, as being usable as an error correction code in the error correction code encoding unit 202 an the error correction code decoding unit 204 of the circuit shown in FIG. 15.

A pseudo product code is formed as follows. Information symbols of a first series are arranged in a rectangular matrix form, and columnar linear-structure error correction codes are formed, followed by addition of information symbols of a second series. Then, linear-structure error correction codes are formed in the line direction, on the entity composed of columnar-direction-encoded first series information code and the second series information symbols.

FIG. 17 shows an example of the pseudo product code codeword. As in the case of the product code described above, codes of the direction consecutive on a magnetic tape 207 are referred to as C1 codes (internal codes), while the codes in the other direction are referred to as C2 codes (external codes).

In the pseudo product code codeword shown in FIG. 17, a C1 code is a linear error correction code having a code length of 12 symbols and a parity number of 4 symbols and capable of correcting up to 2 symbols at the maximum, while a C2 code is a linear error correction code having a code length of 14 symbols, parity number of 4 symbols and capable of correcting up to 2 symbols at the maximum. Information symbols of the first series are stored in a rectangle composed of 6 symbols in the C1 code direction and 10 symbols in the C2 code direction. Information symbols of the second series are stored in the starting two symbols of the C1 code information symbols. This pseudo product code is a modification of the above-described product code and, hence, is not a perfect product code.

The symbol group 222 shown in FIG. 17 constitutes C2 codes, but the symbol group 223 does not form C2 codes. This is because, while the information symbols of the first series constitute both the C2 and C1 codes, the information symbol of the second series constitute only the C1 codes.

In most cases, the information symbols of the second series carry information of the type which is needed prior to decoding of the C2 code. For instance, information symbols of the second series carry position information which are necessary for arraying discontinuously-appearing C1 codes into the form of the pseudo-product code.

The pseudo product code encoding unit, which corresponds to the error correction code encoding unit 202 of FIG. 15, operates to rearrange the first-series information symbols that are inputted in accordance with the direction of arrangement of the C1 codes into the direction of arrangement of the C2 codes, thereby encoding these information symbols into the C2 codes, and also to add the parity symbols of the C2 codes. Further, the pseudo product code encoding unit is operative to adequately select the information symbols of the second series and the C2-encoded results rearranged into the C1 code direction, and to encode the selected symbols and the rearranged encoded results into C1 codes and, further, to add parity symbols for the C1 codes, thus outputting the pseudo product code.

FIG. 18 shows an example of conventional pseudo product code decoding unit 240 which corresponds to the error correction code decoding unit 204 shown in FIG. 15. The pseudo product code decoding unit 240 has an input terminal 241, a C1 code decoding unit 242, a second-series information extracting unit 243, a first interleave unit 244, a C2 code decoding unit 245, a second interleave unit 246, a repetitive decoding unit 247, a first-series information symbol extracting unit 248, an output terminal 249, and another output terminal 250.

The C1 code decoding unit 242 decodes pseudo product codes supplied through the input terminal 241 in the sequence of the C1-code direction into predetermined C1 codes, and performs error correction within a error-correctable range that is determined by the codes. The C1 code decoding unit 242 then delivers the error-corrected decoded result to the second-series information symbol extracting unit 243 and also to the first interleave unit 244.

The second-series information symbol extracting unit 243 extracts second-series information symbols contained in the result of decoding of the pseudo product code in terms of the C1 codes received from the C1 code decoding unit 242, and delivers the extracted second-series information symbols to the output terminal 250.

The first interleave unit 244 receives pseudo product code in terms of the C1 codes from the C1 code decoding unit 242, and supplies pseudo product code in terms of the C2 code to the C2 code decoding unit 245.

The C2 code decoding unit 245 decodes pseudo product codes supplied from the first interleave unit 244 in the sequence of the C2-code direction into predetermined C2 codes, and performs error correction within an error-correctable range that is determined by the codes. The C2 code decoding unit 245 then delivers the error-corrected decoded result to the second interleave unit 246. Since only part of the pseudo product codes supplied from the first interleave unit 244 constitutes the C2 codes, the C2 code decoding unit 245 performs decoding only on the part of the pseudo product codes that provides C2 codes. Thus, the remainder part of the pseudo product code is delivered to the second interleave unit 246 without being decoded.

For instance, when a pseudo product code codeword as shown in FIG. 17 has been input, the C2 code decoding unit performs the error correction by treating the pseudo product code as being C2 codes and delivers the error-correction result to the second interleave unit 246, while the symbols of the symbol group 222 are being received from the first interleave unit 244.

In contrast, while symbols of the symbol group 221 or the symbol group 223 are being received from the first interleave unit 244, the C2 code decoding unit 245 delivers the pseudo product codes to the second interleave unit 246 as they are, i.e., without effecting any error correction.

The second interleave unit 246 delivers to the repetitive decoding unit 247 the pseudo product codes received from the C2 code decoding unit 245, as the C1 codes.

The repetitive decoding unit 247 repeats the decoding processing for decoding the pseudo product codes that are supplied from the second interleave unit 246 in the sequence of the C1 code direction. More specifically, the repetitive dividing unit 247 performs decoding processings in a sequence such as C1 code decoding, C2 code decoding, . . . , C1 code decoding and C2 code decoding, and delivers the results to the first-series information symbol extracting unit 248.

The first-series information extracting unit 248 extracts, from among the pseudo product codes supplied from the repetitive decoding unit 247 in the sequence of the C1 code direction, only the information symbols of the first series and delivers the thus-extracted symbols to the output terminal 249.

As a result of the described operation of the pseudo product code unit 240, the pseudo product code codewords received through the input terminal 241 in the sequence of the C1 code direction are decoded and error-corrected, so that the information symbols of the first series are obtained at the output terminal 249, while the information symbols of the second series are obtained at the output terminal 250.

The repetitive decoding unit 247 performs, on the pseudo product code codewords that are input in the sequence of the C1 code direction, decoding processing one time by treating the codewords as the C1 codes and one time as the C2 codes, thus achieving further correction of errors, and delivers the C2 codes in the sequence of the C1 code direction.

The conventional pseudo product code decoding unit 240 of the type shown in FIG. 18 performs the decoding processing four times in total: namely, decoding of C1 codes by the C1 code decoding unit 242, decoding of C2 codes by the C2 code decoding unit 245, decoding of the C1 codes by the C1 code decoding unit 262, and the decoding of the C2 codes by the C2 decoding unit 264.

In the pseudo product code codeword shown in FIG. 16, the symbols in the symbol group 222 constitutes the C2 codeword, but the symbols of the symbol group 223 does not constitute any C2 codeword. Therefore, the C2 code decoding performed by the C2 code decoding unit 245 of the pseudo product code decoding unit 240 shown in FIG. 18 can only effect correction of errors contained in the symbol group 222, and can never correct errors existing in the symbol groups 221 and 223.

Thus, the pseudo product code decoding unit 240 cannot correct errors contained in the symbol groups 221 and 223 of the pseudo product code codeword of FIG. 17, despite the execution of decoding of the C2 codes. As a consequence, the capability of correcting error in the product code obtained through the repetitive decoding is impaired.

A description will be now given with reference to FIG. 19 showing the result of decoding effected on the product code codeword of FIG. 16, as obtained when errors are contained in this product code codeword. Referring to FIG. 19, three error symbols exist in the horizontal direction, so that error correction cannot be effected at all in the first C1 code decoding processing. In the subsequent C2 code decoding processing, however, error that has existed in the parity symbol of the C1 code can be corrected. All the errors are corrected by a second C1 code decoding processing.

FIG. 20 shows the results of decoding of the pseudo product code codeword of FIG. 17, as obtained when the same errors as those explained with reference to FIG. 19 exist in the pseudo product code codeword. Referring to FIG. 19, the error in the parity symbols of the C1 code in the symbol group 223 of FIG. 17 is not corrected despite the decoding of the C2 codes, so that the error correction cannot be achieved at all, unlike the case of FIG. 19. Thus, the decoding of pseudo product code by the conventional pseudo product code decoding unit 240 undesirably provides inferior error correcting ability, as compared with the case of a perfect product code that has almost the same parameters as the pseudo product code.

SUMMARY OF THE INVENTION

Accordingly, an object of the present invention is to provide a pseudo product coding/decoding apparatus and method that offer improved ability for error correction on pseudo product codes, thereby obviating the above-described shortcoming of the known arts.

To this end, the pseudo product code decoding apparatus and method of the present invention perform the following processings: a first error correction code decoding processing for effecting error correction by using parity symbols of a first linear-structure error correction code contained in a symbol train that constitutes a pseudo product code codeword, the pseudo product code codeword being formed by adding, to an array of first-series information symbols, a second linear-structure error correction code regarding external code, adding thereto second-series information symbols, and adding, to the first-series information symbols with the second linear-structure error correction code and the second-series information symbols added thereto, the first linear-structure error correction code regarding internal code; a second error correction code decoding process for effecting error correction by using parity symbols of the second linear-structure error correction code; a second-series information symbol extracting processing for extracting the second-series information symbols from the symbol train constituting the pseudo product code; a subtraction code generating processing for generating a subtraction code of a pseudo product code codeword formed of the second-series information symbols extracted by the second-series information symbol extracting process, with the first-series information symbol portion and the second linear-structure error correction code portion being changed to zero codes; a transforming processing for subtracting, from the symbol train of the pseudo product code codeword, the subtraction code generated by the subtraction code generating process, thereby transforming the pseudo product code codeword into a product code codeword; an error correction code repetitive decoding processing for effecting decoding processings a plurality of times on the symbol train of the product code codeword formed by the transforming process, thereby effecting error correction; and a first-series information symbol extracting processing for extracting the first-series information symbols from the symbol train constituting the product code codeword obtained by the error correction code repetitive decoding process.

With the pseudo product code decoding apparatus and method of the invention having features set forth above, it is possible to correct any error existing in the first-series information symbols, even when second-series information symbols have been added to the symbol train to form a pseudo product code codeword, by virtue of the transformation of the pseudo product code codeword into a product code codeword and subsequent repetitive encoding processings.

These and other objects, features and advantages of the present invention will become clear from the following description of the preferred embodiment when the same is read in conjunction with the accompanying drawings.

DESCRIPTION OF THE PREFERRED EMBODIMENTS

Figure 1:
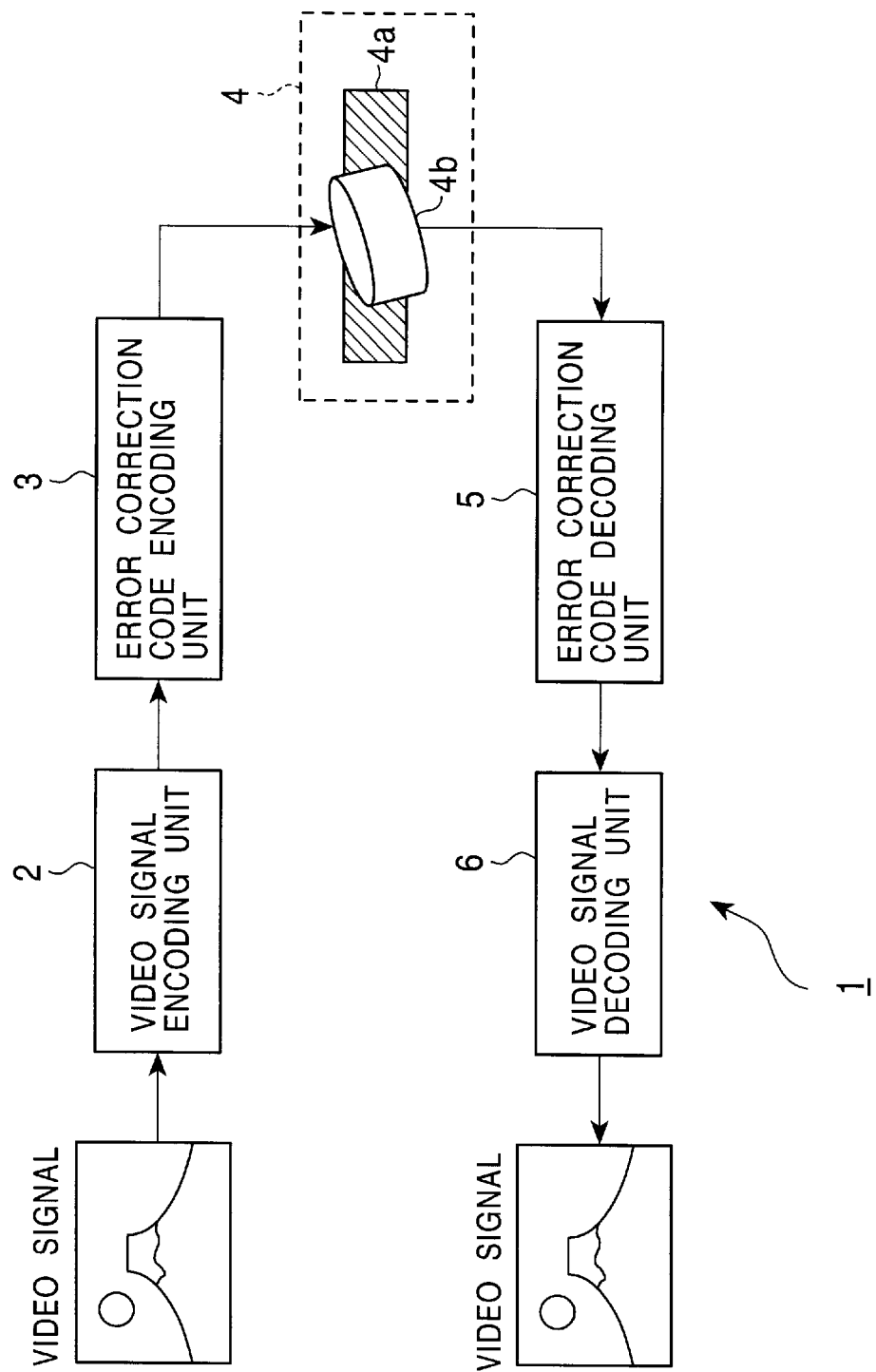
FIG. 1 is a bock diagram of a recording/playback apparatus incorporating the present invention.

A detailed description will now be given of an embodiment of the present invention. The present invention may be incorporated in, for example, a recording/playback apparatus of the type shown in FIG. 1.

The recording/playback apparatus, denoted by 1, has the following components: a video signal encoding unit 2 which receives video signals; an error correction code encoding unit 3 which receives encoded video data from the video signal encoding unit 2; a recording/playback unit 4 which receives error-corrected video data from the error correction code encoding unit 3; an error correction code decoding unit 5 which receives video data reproduced from a magnetic tape 4a by a rotary head 4b of the recording/playback unit 4; and a video signal decoding unit 6 which receives error-corrected video data from the error correction code decoding unit 5 and forms video signals to be output from the recording/playback apparatus 1.

In operation of the recording/playback apparatus 1, video signals supplied to the video signal encoding unit 2 are changed into digital video data to be recorded in the magnetic tape 4a. Video data reproduced from the magnetic tape 4a is converted into analog video signals and output externally.

The video signal coding unit 2 effects encoding processing on the video signals input thereto. More specifically, the video signal encoding unit 2 effects an encoding processing so as to convert the video signals into digital video data composed of "0" and "1", and delivers the resultant digital video data to the error correction code encoding unit 3.

The error correction code encoding unit 3 performs encoding of the video data received from the video signal encoding unit 2 such that the video data constitute error correction codes of a pseudo product code codeword, and adds error correction redundant symbols (parity symbols).

Figure 2:
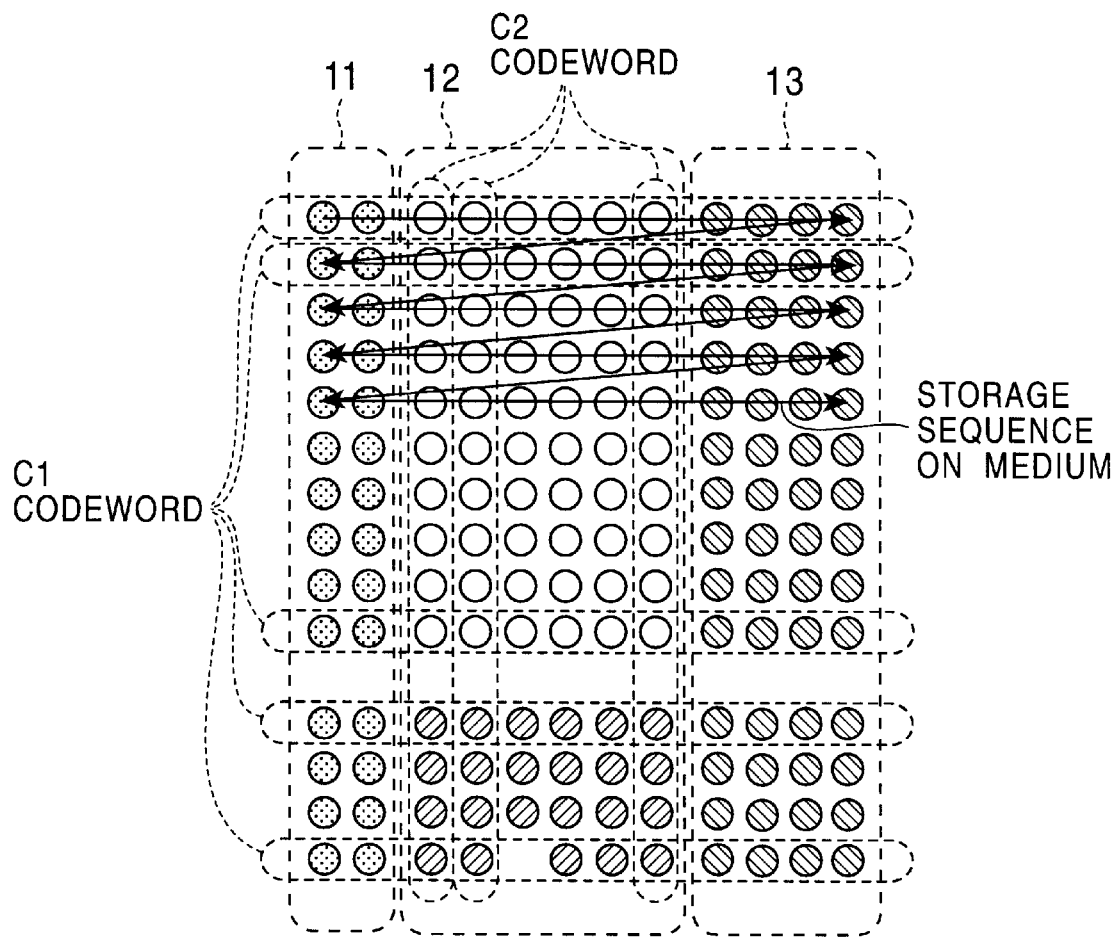
FIG. 2 is an illustration of a pseudo product codeword.

As will be seen from FIG. 2, the above-mentioned pseudo product code codeword is composed of the following parts: a product code containing symbol groups 12 and 13 which are formed by arranging first-series information symbols in a rectangular matrix-like form and forming parity symbol serving as linear-structure error correction codes both in the line and column directions of the matrix form; and a symbol group 11 added to the product code 12, 13 and constituted by information symbols of a second series. In this pseudo product code codeword, the codes that are consecutive in the direction of the magnetic tape 4a are referred to as "C1 codes" (internal codes), while codes consecutive in the direction perpendicular to the C1 codes are referred to as "C2 codes" (external codes). At the same time, the parity symbols that are added to the first-series information symbols in the line direction are referred to as "C1-code party symbols", while the parity symbols that are added to the first-series information symbols in the column direction are referred to as "C2-code party symbols".

This pseudo product code codeword is formed by first arranging the first-series information symbols in the rectangular matrix-like form, forming the C1-code party symbols, adding the second-series information symbols, and forming the C2-code party symbols on the entity of symbols that is composed of the first-series information symbols encoded in the columnar direction and the second-series information symbols.

In the pseudo product code codeword shown in FIG. 2, the C1 code is a linear error correction code which has a code length of 12 symbols and a parity number of 4 symbols and which is capable of effecting correction of up to 2 symbols at the greatest, while the C2 code is a linear error correction code which has a code length of 14 symbols and a parity number of 4 symbols and which is capable of effecting correction of up to 2 symbols at the greatest. The first-series information symbols are stored in a rectangle which has 6 symbols in the C1-code direction and 10 symbols in the C2-code direction. Among the 12 symbols constituting the C1 code, the leading-end two symbols are information symbols of the second series.

Referring further to FIG. 2, the symbol group 12 constitute C2 codes, while the symbol group 13 does not. This is because, while the information symbols of the first series constitute both the C2 codes and C1 codes, the information symbols of the second series constitute only the C1 codes.

In most cases, the information symbols of the second series carry information which are needed prior to the decoding of the C2 codes, such as position information to be used in arranging discontinuously-appearing C1 codes into the form of the pseudo product code.

Figure 3:
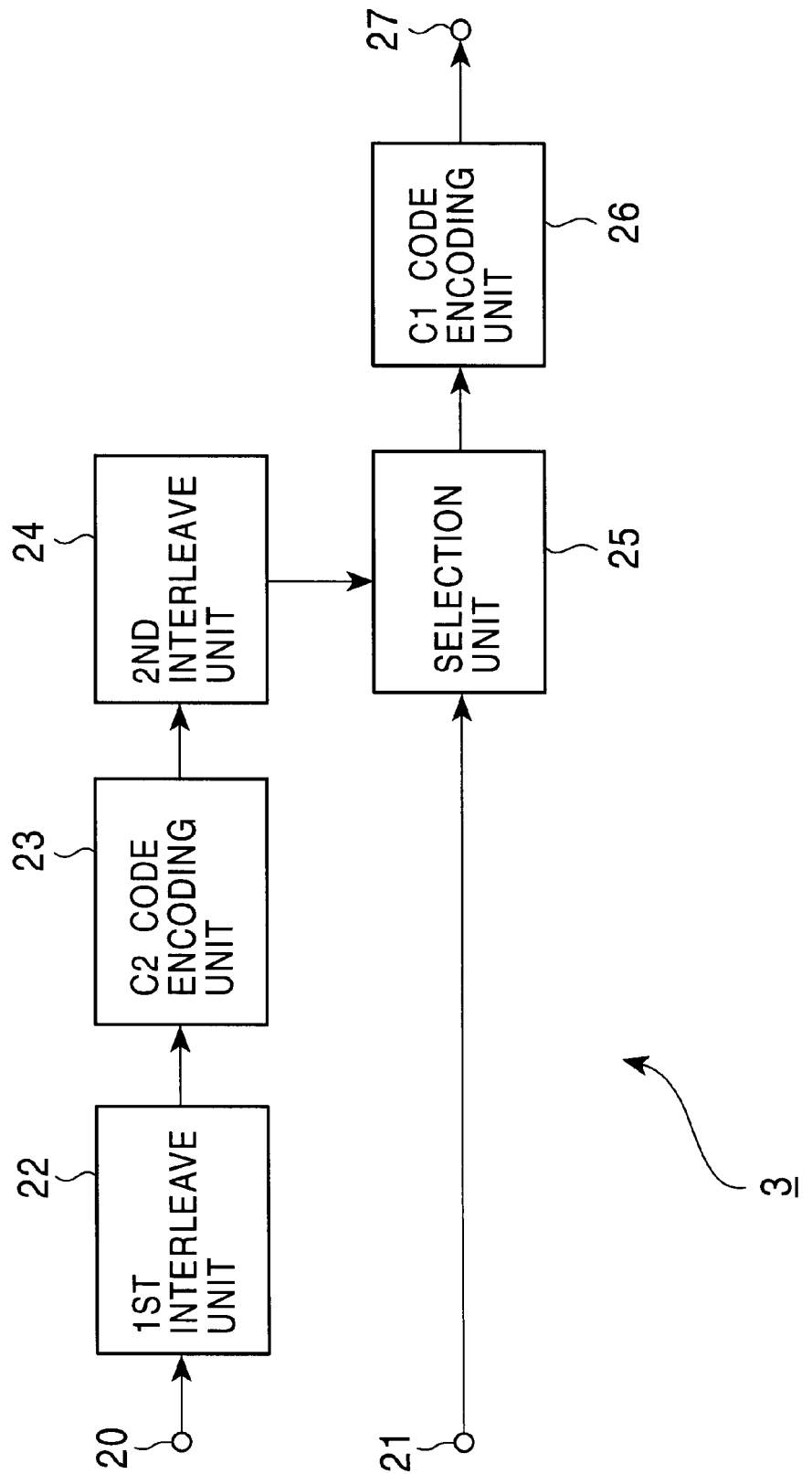
FIG. 3 is a block diagram of an error correction code encoding unit used in the recording/playback apparatus incorporating the present invention.

As will be seen from FIG. 3, the above-mentioned error correction code encoding unit 3 has an input terminal for receiving first-series information symbols from the video signal encoding unit 2, and another input terminal 21 for receiving information symbols of the second series. The error correction code encoding unit 3 further has a first interleave unit 22, a C2 code encoding unit 23 and a second interleave unit 24 which in cooperation serve to add C2-code party symbols to the first-series information symbols. The error correction code encoding unit 3 further has a selection unit 25 which adequately selects information symbols of the first and second serieses, and a C1 code encoding unit 26 which serves to add C1-code party symbols, the result of which is delivered to an output terminal 27.

The first-series information symbols are supplied through the input terminal in the sequence of the C1-code direction. A batch of first-series information symbols corresponding to one codeword of the pseudo product code is stored in the first interleave unit 22. The first interleave unit 22 delivers the successive batches of the first-series information symbols to the C2 code encoding unit 23 in the sequence of the C2-code direction.

Upon receipt of the successive batches of first-series information symbol supplied in the sequence of C2-code direction from the first interleave section 22, the C2 code encoding unit 23 encodes the first-series information symbols into predetermined C2 codes, followed by addition of C2-code party symbols, the results being delivered to the second interleave unit 24.

A batch of successive C2 codes that are supplied from the C2 code encoding unit 23 in the sequence of the C2-code direction, corresponding to one codeword of the pseudo product code, is stored in the second interleave unit 24. Successive C2 codes are then delivered to the selection unit 25 in the sequence of the C1-code direction.

The selection unit 25 performs such a processing that a predetermined number of second-series information symbols supplied from the input terminal 21 are added to the leading end of each of C2-code encoding results supplied to the selection unit 25 from the second interleave unit 24 in the sequence of the C1-code direction. In other words, the selection unit 25 serves to add the second-series information symbols so as to insert these symbols to the successive C2-code encoding results that are supplied thereto in the sequence of the C1-code direction. The C2 codes with the second-series information symbols added thereto are delivered to the C1 code encoding unit 26.

The C1 code encoding unit 26 thus receives the first and second-series information symbols supplied thereto in the sequence of the C1-code direction from the selection unit 25. The C1 code encoding unit 26 encodes these information symbols into C1 codes, and performs a processing to add the C1-code parity symbols to the C2-code parity symbols. The results are delivered to the output terminal 27.

Thus, the error correction code encoding unit 3 operates such that the first-series information symbols, which are supplied through the input terminal 21 in the sequence of the arraying of the C1 codes, are rearranged into the direction of arrangement of the C2 codes, and adds the C2-code parity symbols to the rearranged information symbols, thereby effecting C2 code encoding. The error correction code encoding unit 3 also suitably selects and combines the second-series information symbols received through the input terminal 21 and the C2-code encoding results that have been rearranged in the C1-code direction, and adds C1-code parity symbols, thereby effecting encoding into the C1 codes, whereby a pseudo product code is obtained at the output terminal 27. The pseudo product code is then delivered from the output terminal 27 to the recording/playback unit 4.

The recording/playback unit 4 has the rotary head 4b which receives the video data from the error correction code encoding unit 3, and the magnetic tape 4 in and from which video data is recorded and read by the rotary head 4b. The rotary head 4b has a plurality of recording magnetic heads carried by a rotary mechanism which is not shown. In the recording mode of operation of the recording/playback apparatus, the rotary head 4b operates to record in the magnetic tape 4a the error-correction-encoded video data input from the error correction code encoding unit 3, by using these recording magnetic heads. The rotary head 4b also has a plurality of reproducing magnetic heads carried by a rotary mechanism not shown. In the playback mode of operation, video data is reproduced by these reproducing magnetic heads and is output to the error correction code decoding unit 5.

The error correction code decoding unit 5, upon receipt of the video data from the rotary head 4b, decodes the data as error correction codes, and performs processing to correct any error incurred during recording or reproduction, while generating uncorrectable video data detection information. The error correction code decoding unit 5 then delivers to the video signal decoding unit 6 the decoded video data and the uncorrectable video data detection information. The detail of the configuration of the error correction code decoding unit 5 will be given later.

The video signal decoding unit 6 generates video signals by decoding the video data received from the error correction code decoding unit 5. Based on the uncorrectable error detection information which also is received from the error correction code decoding unit 5, the video signal decoding unit 6 also performs processing for minimizing influence of any error of video data by, for example, excluding the error-containing video data from the decoding and interpolation based on sound video data. The video signal decoding unit 6 outputs the thus-generated video signals externally of the recording/playback apparatus.

Figure 4:
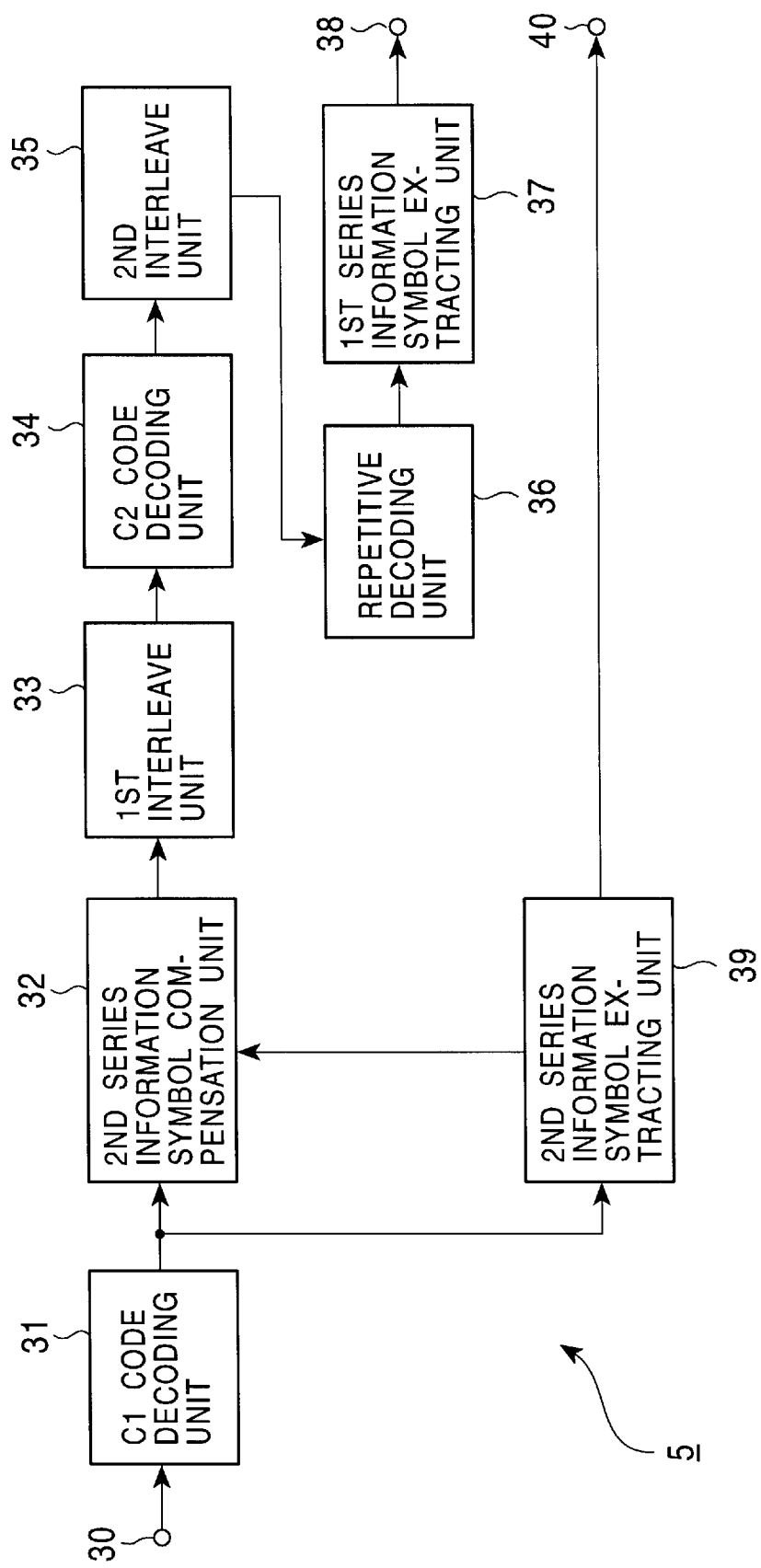
FIG. 4 is a block diagram of an error correction code decoding unit used in the recording/playback apparatus incorporating the present invention.

As shown in FIG. 4, the above-described error correction code decoding unit 5 is so configured that a pseudo product code input through an input terminal 30 is output from an output terminal 38, after correction of errors of first-series information symbols, through a C1 code decoding unit 31, a second-series information symbol compensation unit 32, a first interleave unit 33, a C2 code decoding unit 34, a second interleave unit 35, a repetitive decoding unit 36, and a first-series information extracting unit 37. At the same time, the error correction code decoding unit 5 serves to output second-series information symbols from a second-series information symbol extracting unit 39 via an output terminal 40.

The C1 code decoding unit 31 receives the pseudo product codes that are supplied in the sequence of C1-code direction from the input terminal 30, and decodes the received pseudo product codes into predetermined C1 codes. The C1 code decoding unit 31 then executes a processing for effecting correction within a correctable range that is determined by the code, and delivers the error-corrected result to the second-series information symbol compensation unit 32 and the second-series information symbol extracting unit 39.

The second-series information symbol extracting unit 39 performs a processing for extracting second-series information symbols contained in the pseudo product code in terms of the C1 codes supplied from the C1 code decoding unit 31, and delivers the result to the output terminal 40 and also to the second-series information symbol compensation unit 32.

The second-series information symbol compensation unit 32 performs a processing to convert, into a product code, the pseudo product code coming from the C1 code decoding unit 31, by using the second-series information symbols derived from the second-series information symbol extracting unit 39, and delivers the resultant product code into the first interleave unit 33 in the sequence of the C1 codes.

Figure 5:
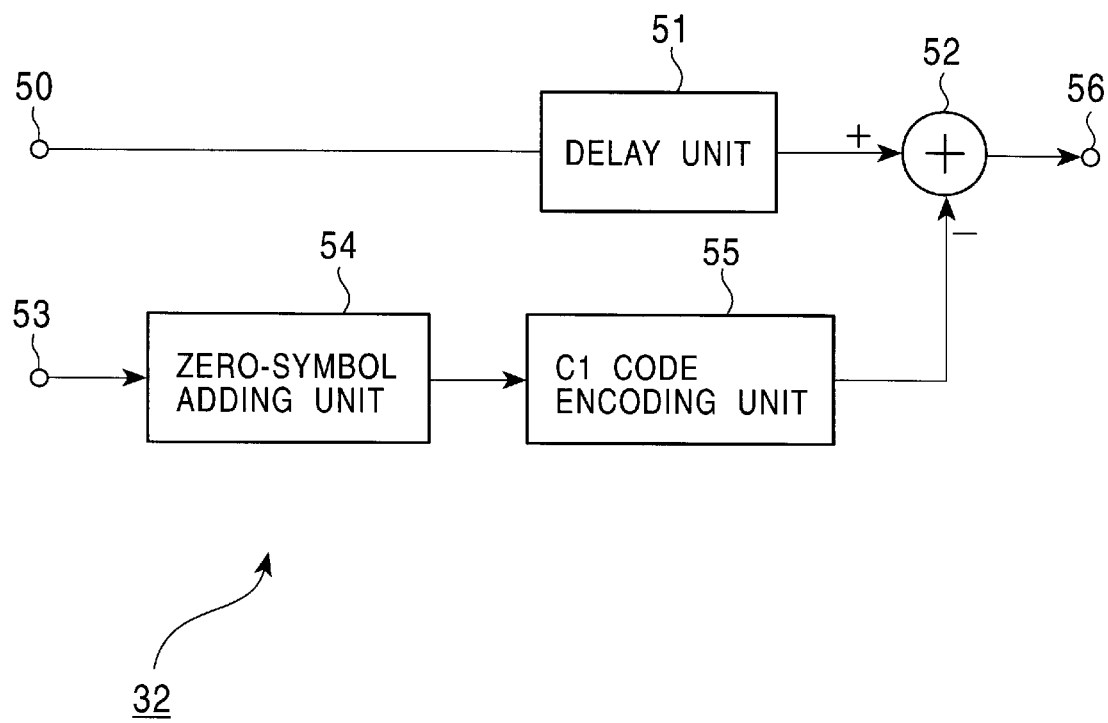
FIG. 5 is a block diagram of a second-series information-symbol-compensation unit used in the recording/playback apparatus incorporating the present invention.

The second-series information symbol compensating unit 32 has, for example, a configuration as shown in FIG. 5. More specifically, referring to FIG. 5, the second-series information symbol compensating unit 32 has an input terminal 50 for receiving the pseudo product code from the C1 code decoding unit 31, a delay unit 51, and a subtracting unit 52. The second-series information symbol compensating unit 32 also has an input terminal 53 for receiving second-series information symbols from the second-series information symbol extracting unit 39, a zero-symbol adding unit 54, and a C1 code encoding unit 55. The output from the subtracting unit 52 is output to the first interleave unit 33 via the output terminal 56.

The delay unit 51 receives the pseudo product code from the C1 code decoding unit 31 via the input terminal 50, and temporarily stores the received pseudo product code. The timing of delivery of the pseudo product code from the delay unit 51 to the subtracting unit 52 is controlled by a timing controller which is not shown.

The zero code adding unit 54 receives the second-series information symbols from the second-series information extracting unit 39 via the input terminal 53. The zero code adding unit 54 performs, by using the second-series information symbols, a processing for adding a zero code so that the first-series information symbol portion and the C2-code parity symbol portion of the pseudo product code of FIG. 2 become zero codes.

Figure 6:
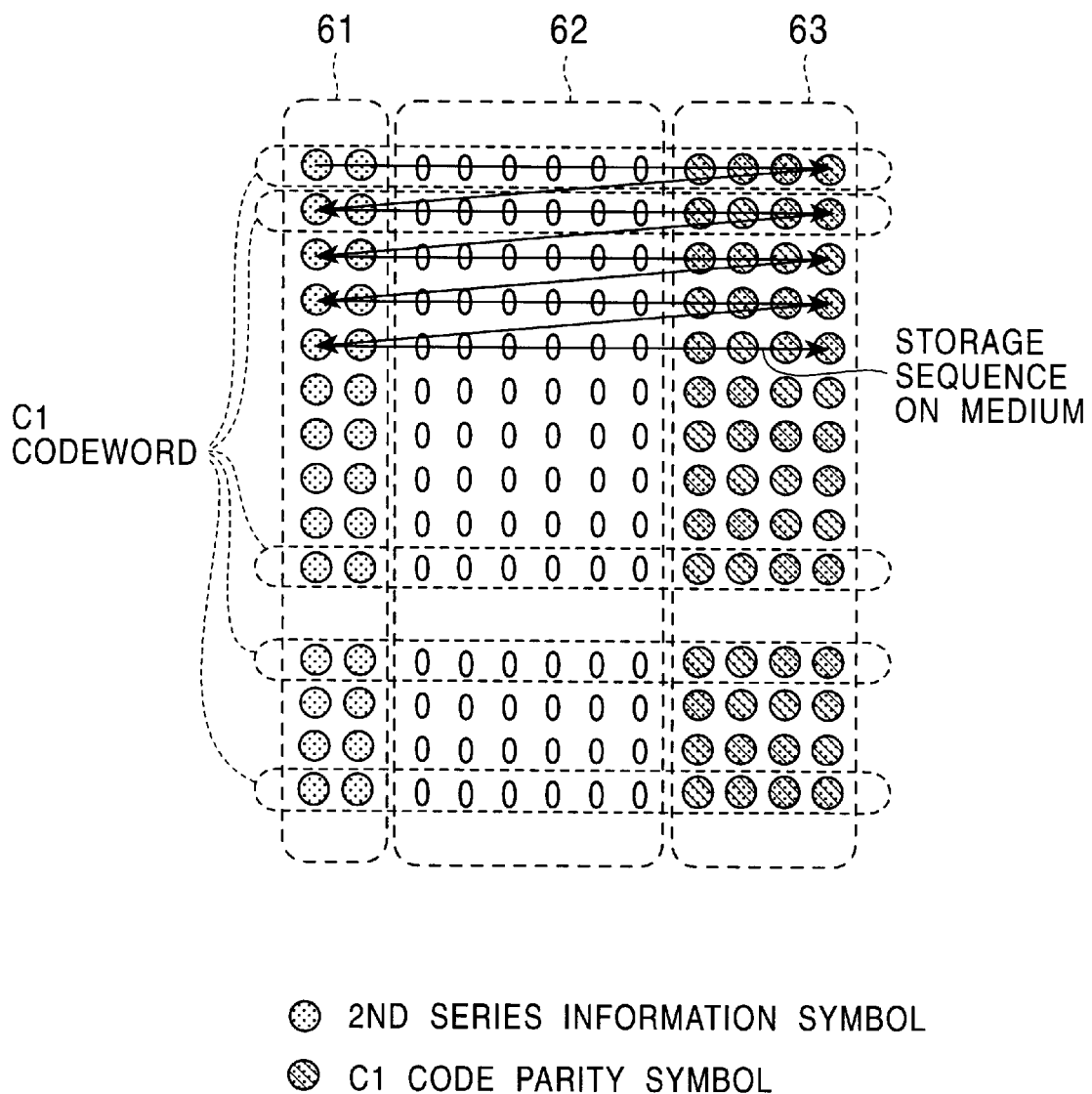
FIG. 6 is an illustration of a pseudo product code obtained through a processing for substituting null codes for the first-series information symbol portion and the C2 code parity symbol portion of the pseudo product code shown in FIG. 2.

The C1 code encoding unit 55 executes a processing to add C1-code parity symbols to the processing result obtained from the zero-code adding unit 54, thereby forming a pseudo product code as shown in FIG. 6, and delivers the thus-obtained pseudo product code to the subtracting unit 52.

In the pseudo product code shown in FIG. 6, the first-series information symbols are zero codes, so that the C2-code parity symbols added as the C2 codes are also zero codes. Namely, the from the viewpoint of sequence of the C1 codes, the pseudo product code shown in FIG. 6 can be regarded as being a group of C1 codewords formed by adding a zero code to the trailing end of the second-series information symbols and adding thereto parity symbols as the C1 code.

The subtracting unit 52 receives the pseudo product code such as that shown in FIG. 6 from the C1 code encoding unit 55, while receiving another pseudo product code from the delay unit 52, and performs a processing to subtract pseudo product code as the output of the C1 code encoding unit 55 from the pseudo product code as the output of the delay unit 51. Consequently, the subtracting unit 52 subtracts zero codes from the first-series information symbols, while subtracting the second-series information symbols, thereby generating a pseudo product code as shown in FIG. 7.

Figure 7:
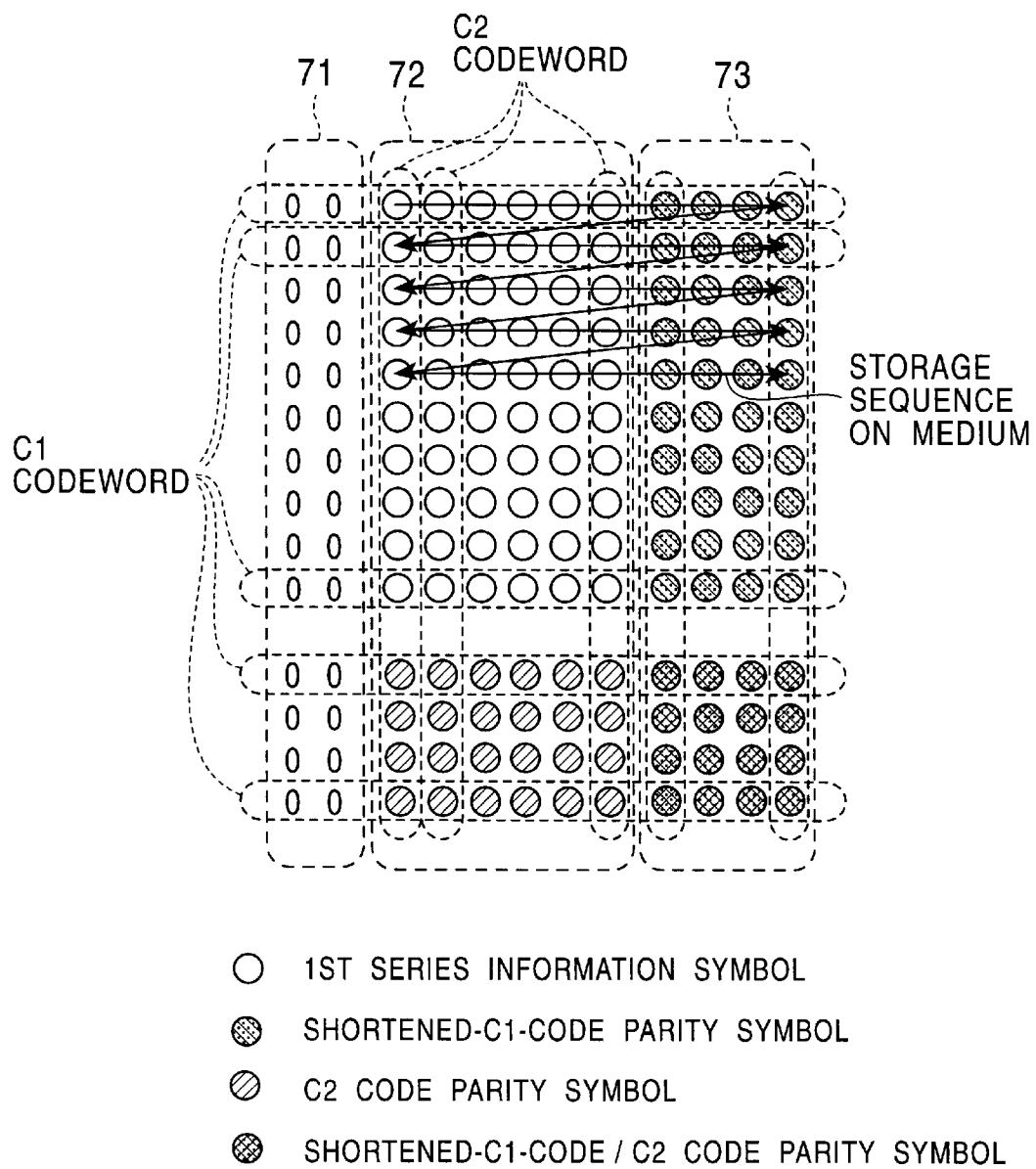
FIG. 7 is an illustration of the process for transforming the pseudo product code into product code, through subtraction of the pseudo product code shown in FIG. 6 from that shown in FIG. 2.

It will be seen that the subtraction result shown in FIG. 7 is a pseudo product code, because both the signal input from the C1 code decoding unit 31 and the signal received from the second-series symbol extracting unit 39 are pseudo product codes. Further, since the first-series information symbols and the C2-code parity symbols that constitute the symbol group 62 of FIG. 6 are zero codes, the information symbols of the symbol group 12 of the pseudo product code shown in FIG. 2 appear as the symbol group 72 of FIG. 7 without any change at all, despite the arithmetic processing. The information symbols of the symbol group 11 shown in FIG. 2 are cancelled by the use of the information symbols of the symbol group 61 of FIG. 6, so that the information symbols of the symbol group 71 of FIG. 7 become zero codes. The parity symbols of the symbol group 13 shown in FIG. 2 are subjected to subtraction processing which uses the parity symbols of the symbol group 63 of FIG. 6, so that the symbol group 73 of FIG. 7 becomes a parity symbol group which is different from the symbol group 13 and the symbol group 63.

In the pseudo product code of FIG. 7 obtained through the above-described processings, all the second-series information symbols constituting the symbol group 71 are zero codes, so that the C1 codes in this pseudo product code are shortened C1 codes with the symbols of the symbol group 71 nullified. Thus, the pseudo product code of FIG. 7 is the result of a processing consisting of performing encoding of the first-series information symbols with regard to the C2 codes, and encoding the result with the shortened C1 codes in which the second-series information symbol portions being nullified. This is the same as a product code which is obtained by effecting encoding first with the C2 codes and then with the shortened C1 codes.

The subtracting unit 52 prevents the second-series information symbols from reaching the output terminal 56, thereby outputting to the output terminal 56 the pseudo product code in terms of the product code as shown in FIG. 7.

Thus, the second-series information symbol compensation unit 32 makes an effective use of the theory that in linear codes the result of subtraction of a codeword from another codeword is also a codeword, in performing the processing for converting the pseudo product code from the C1 code decoding unit 31 into the product code. The second-series information symbol compensation unit 32 then delivers the processing result to the first interleave unit 33.

Figure 8:
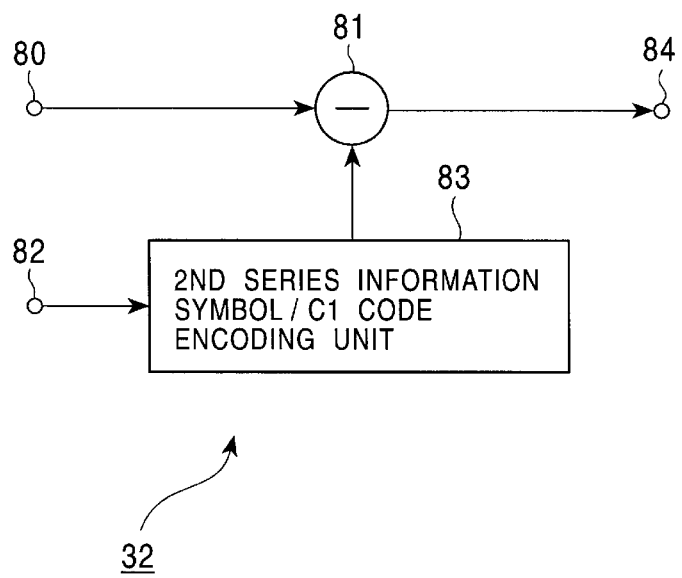
FIG. 8 is a block diagram showing another configuration of the second-series information-symbol-compensation unit used in the recording/playback apparatus incorporating the present invention.

The above-described configuration of the second-series symbol compensation unit 32 is only illustrative and a different configuration such as that shown in FIG. 8 may be used equally well. Referring to FIG. 8, a second-series information symbol compensation unit 32 has an input terminal 80 for receiving pseudo-product code from the C1 code decoding unit 31, and a subtracting unit 81 which receives the pseudo product code via the input terminal 80. The second-series information symbol compensation unit 32 also has an input terminal 82 which receives the second-series information symbols from the second-series information extracting unit 39, and a second-series information symbols C1-code encoding unit 83 which receives the second-series information symbols from the input terminal 82. The output from the subtracting unit 81 is output to the first interleave unit 33 via the output terminal 84.

Upon receipt of second-series information symbols from the second-series information symbol extracting unit 39 via the input terminal 82, the second-series information symbol C1-code encoding unit 83 performs a processing for directly forming C1-code parity symbols to form a pseudo product code as shown in FIG. 6, and delivers the resultant pseudo product code to the subtracting unit 81.

More specifically, the second-series information symbol C1-code encoding unit 83, upon receipt of the second-series information symbols from the input terminal 82, generates the pseudo product code such as that shown in FIG. 6, through formation of the C1-code parity symbols, and delivers the resultant pseudo product code to the subtracting unit 81 at the same timing as the receipt of the pseudo product code from the input terminal 80.

The subtracting unit 81 performs an arithmetic processing to subtract the pseudo product code formed by the second-series information symbol C1-code encoding unit 83 from the pseudo product code received through the input terminal 80. A product code such as that shown in FIG. 7 thus obtained is delivered to the first interleave unit 33 via the output terminal 84.

Unlike the second-series information compensation unit 32 shown in FIG. 5, the second-series information symbol compensation unit 32 shown in FIG. 8 requires the second-series information symbol C1-code encoding unit 83 for the purpose of encoding the second-series information symbols in the context of C1 codes. The second-series information symbol compensation unit 32 shown in FIG. 8, however, does not need any delay device because the need for the time delay to be used for C1-code encoding can be eliminated.

Thus, the second-series information symbol compensation unit 32 shown in FIG. 8 can convert the pseudo product code into the product code and delivers the resultant product code to the first interleave unit 33, at a rate much higher than that is achieved with the second-series information symbol compensation unit 32 of the type shown in FIG. 5.

In the second-series information symbol compensation unit 32 shown in FIG. 8, the sizes or scales of element units such as the second-series information symbol C1-code encoding unit 83 are much smaller than those of the devices or units such as the C1 code decoding unit 31 for decoding the error correction codes. There is no risk that the second-series information symbol C1 code encoding unit 83 becomes unacceptably large, even when the unit 83 is designed to undertake also the jobs such as the generation of the pseudo product code of the type shown in FIG. 6.

The first interleave unit 33 receives the product code from the second-series information symbol compensation unit 32 in the context of the C1 codes, and conducts the same processing s that performed by the first interleave unit 22 of FIG. 5, thereby delivering the product code to the C2 code encoding unit 34, in the sequence which follows the sequence of the C2 codes.

The C2 code decoding unit 34 receives the product code which is supplied from the first interleave unit 33 in a sequence which follows the sequence of the C2 codes, and effects error correction within a correctable range that is determined by the codes. The error-corrected result is delivered to the second interleave unit 35. Unlike the C2 code decoding unit 145 of the conventional apparatus described before, the C2 code encoding unit 34 effects the C2-code decoding on the entirety of the product code that is supplied from the first interleave unit 33, and delivers the decoded result to the second interleave unit 35.

The second interleave unit 35 stores a batch of C2 codes supplied thereto from the C2 code decoding unit 34 in the sequence conforming with the C2-code direction, corresponding to one codeword of the product code, and delivers the product code to the repetitive decoding unit 36 in accordance with a sequence which is the sequence of the C1 codes.

The repetitive decoding unit 36 performs a processing for repeating a plurality of times the processing for decoding the product code supplied from the second interleave unit 35 in accordance with the sequence of the C1 codes. For instance, the repetitive decoding unit 36 executes decoding processings such as C1 code decoding, C2 code decoding, . . . , C1 code decoding, and C2 code decoding, and delivers the result of the repetitive decode processings to the first-series information symbol extracting unit 37.

Figure 9:
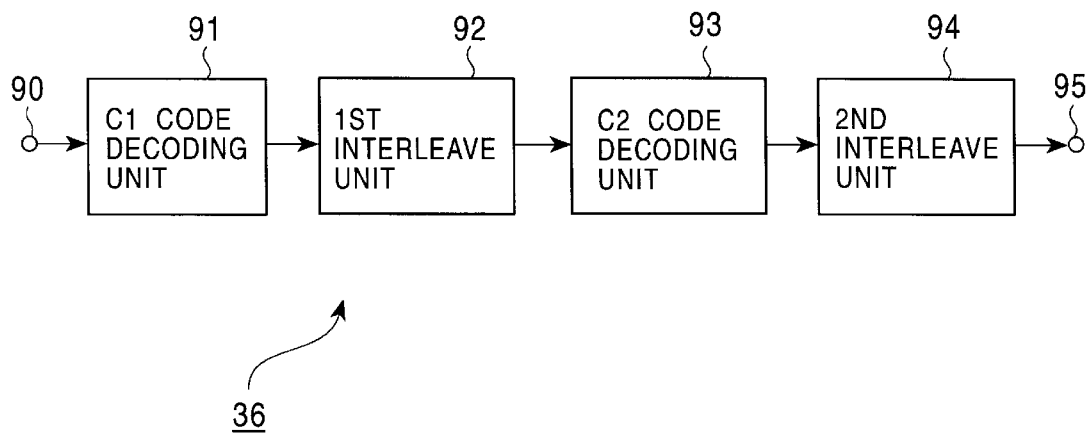
FIG. 9 is an illustration of the configuration of a repetitive decoding unit in the error correction code decoding unit used in the recording/playback apparatus incorporating the present invention.

By way of example, the repetitive decoding unit 36 has, as shown in FIG. 9, an input terminal 90 to which a product code is supplied from the second interleave unit 35 in the sequence of the C1 codes. The repetitive decoding unit 36 further has a C1 code decoding unit 91, a first interleave unit 92, a C2 code decoding unit 93, a second interleave unit 94, and an output terminal 95 which are arranged in this order. The operations of the C1 code decoding unit 91, first interleave unit 92, C2 code decoding unit 93, and the second interleave unit 94 are the same as those of the C1 code decoding unit 31, first interleave unit 33, C2 code decoding unit 34, and the second interleave unit 36 which are shown in FIG. 4 and, therefore, detailed description is omitted.

The repetitive decoding unit 36 effects decoding processing on the product code supplied from the input terminal 90 in the sequence of the C1-code direction, one time in terms of the C1 codes and one time in terms of the C2 codes, thereby effecting a further correction of the error, and delivers the correction result to the output terminal 95 in the sequence of the C1 codes.

When the repetitive decoding unit 36 shown in FIG. 9 is used, the error correction code decoding unit 5 performs the decoding processings four time: namely, a C1 code decoding processing performed by the c1 code decoding unit 31, a C2 code decoding processing performed by the C2 code decoding unit 34, a C1 code decoding processing performed by the C1 code decoding unit 91, and a C2 code decoding processing performed by the C2 code decoding unit 93.

Figure 10:
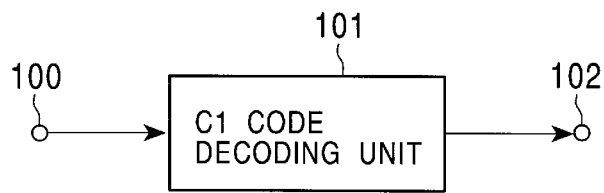
FIG. 10 is an illustration of another configuration of a repetitive decoding unit in the error correction code decoding unit used in the recording/playback apparatus incorporating the present invention.

The above-described configuration of the repetitive decoding unit 36 is only illustrative and a different configuration such as that shown in FIG. 10 may be used. The repetitive decoding unit 36 shown in FIG. 10 has a C1 code decoding unit 101 which decodes product code input thereto from the second interleave unit 35 in the sequence conforming with the C1-code direction.

The C1 decoding unit 101 executes the same processing as that performed by the aforementioned C1 code decoding unit 31. Namely, the C1 code decoding unit 101 effects error correction through the decoding of the received product code, and delivers the error-corrected result to the first-series information symbol extracting unit 37 via the output terminal 102.

Figure 11:
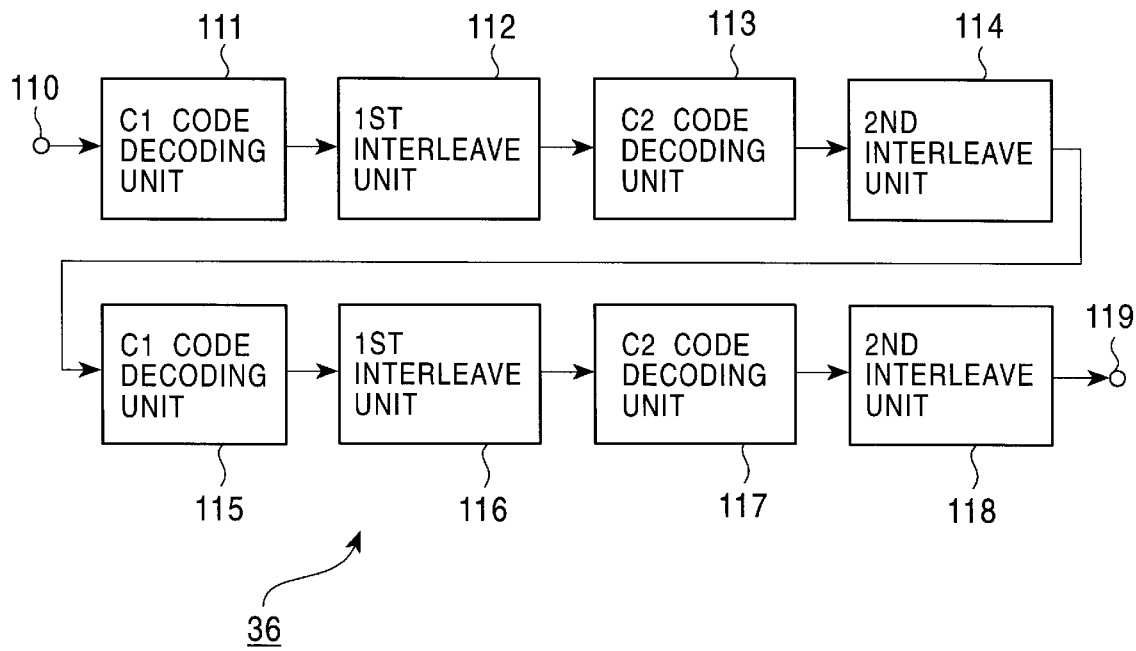
FIG. 11 is an illustration of still another configuration of a repetitive decoding unit in the error correction code decoding unit used in the recording/playback apparatus incorporating the present invention.

A configuration of the repetitive decoding unit 36 shown in FIG. 11 also may be used. This repetitive decoding unit 36 has the following components: a C1 code decoding unit 111 for decoding product code received through an input terminal 110 from the second interleave unit 35 in the sequence of the C1-code direction, a first interleave unit 112, a C2 code decoding unit 113, a second interleave unit 114, another C1 code decoding unit 115, another first interleave unit 116, another C2 code decoding unit 117, and another second interleave unit 118. The C1 code decoding units 111 and 115 perform the same processing as that performed by the aforesaid C1 code decoding unit 35. The first interleave units 112 and 116 perform the same processing as that performed by the aforesaid first interleave unit 33. Likewise, the second interleave units 114 and 118 perform the same processing as that performed by the aforesaid second interleave unit 35.

The error correction code decoding unit 5 having the repetitive decoding unit 36 of FIG. 11 performs, on the product code received through the input terminal 30, three times of decoding processings in terms of the C1 codes and three times of decoding processings in terms of the C2 codes, thereby further enhancing the error correction ratio.

The first-series information symbol extraction unit 37 extracts only the first-series information symbols from among the product code supplied from the repetitive decoding unit 36 in the sequence of the C1-code direction, and delivers the,extracted first-series information symbols to the output terminal 38.

The described error correction code decoding unit 5 serves to deliver the product code containing the first-series information symbols to the video signal decoding unit 6, and also to deliver the second-series information symbols from the second-series information symbol extracting unit 39 to the video signal decoding unit 6 via the output terminal 40.

For instance, a pseudo product codeword containing error symbols of FIG. 2 is processed by the described error correction code decoding unit 5 in a manner described below. As the first step, the combination of the zero-code adding unit 54 and the C1 code decoding unit 55 shown in FIG. 5, or the second-series information symbol C1-code encoding unit 83 shown in FIG. 8, performs a processing on the pseudo product code shown in Part (a) of FIG. 12, so as to add zero codes to the first-series information symbol portion and to the C2-code parity symbol portion and also to form and add C1-code parity symbols, as shown in Part (b) of FIG. 12.

Figure 12:
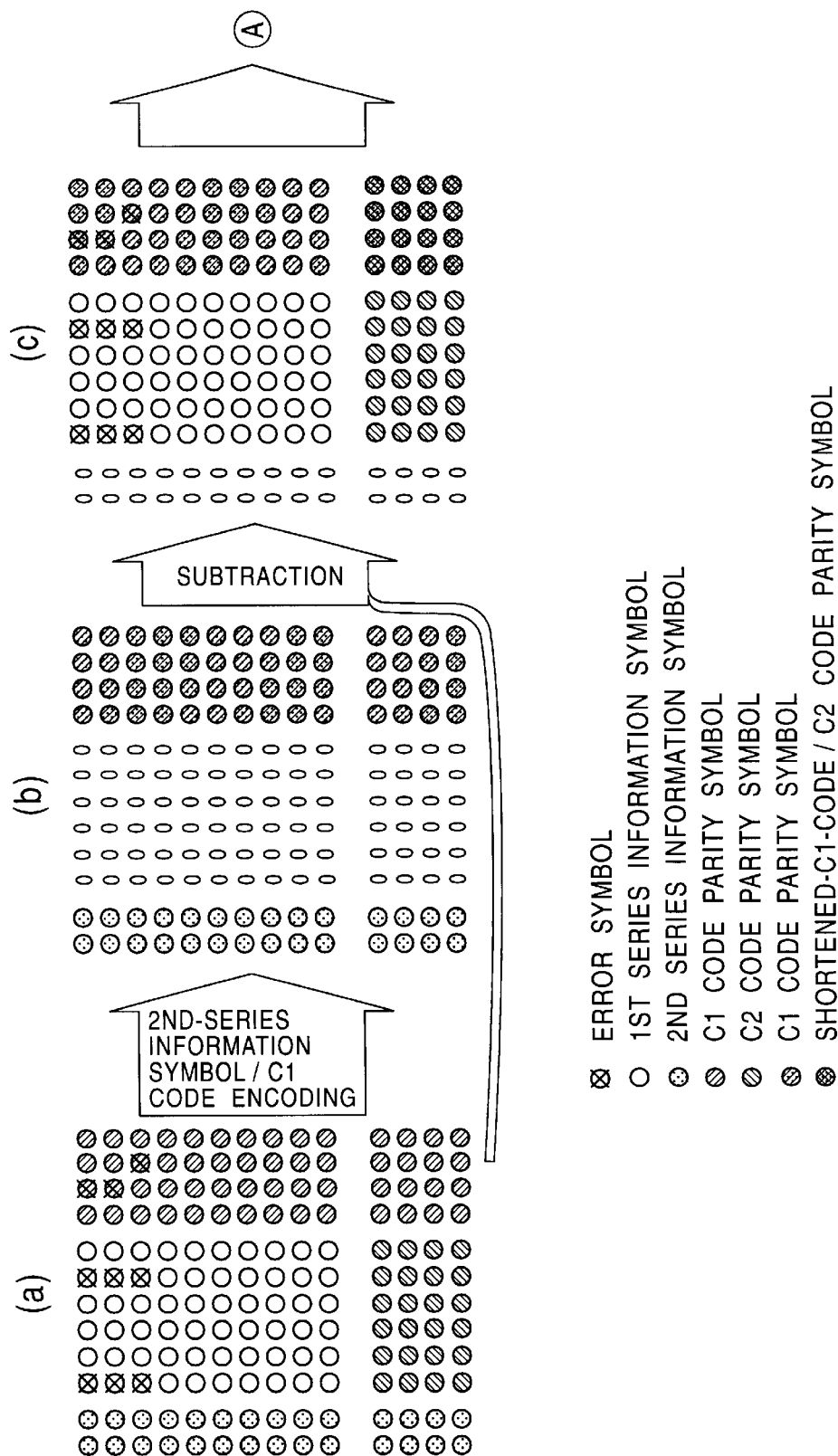
FIG. 12 is an illustration of the process for decoding a pseudo product code by the error correction code decoding unit used in the recording/playback apparatus incorporating the present invention.

Then, the pseudo product code obtained as in Part (b) of FIG. 12 is delivered to the subtracting unit 52 or the subtracting unit 81, so as to be subtracted from the pseudo product code shown in Part (a) of FIG. 12. As a result, the second-series information symbols of the pseudo product code input through the input terminal 30 are nullified as shown in Part (c) of FIG. 12, thus being converted into a product code as shown in Part (a) of FIG. 13.

Figure 13:
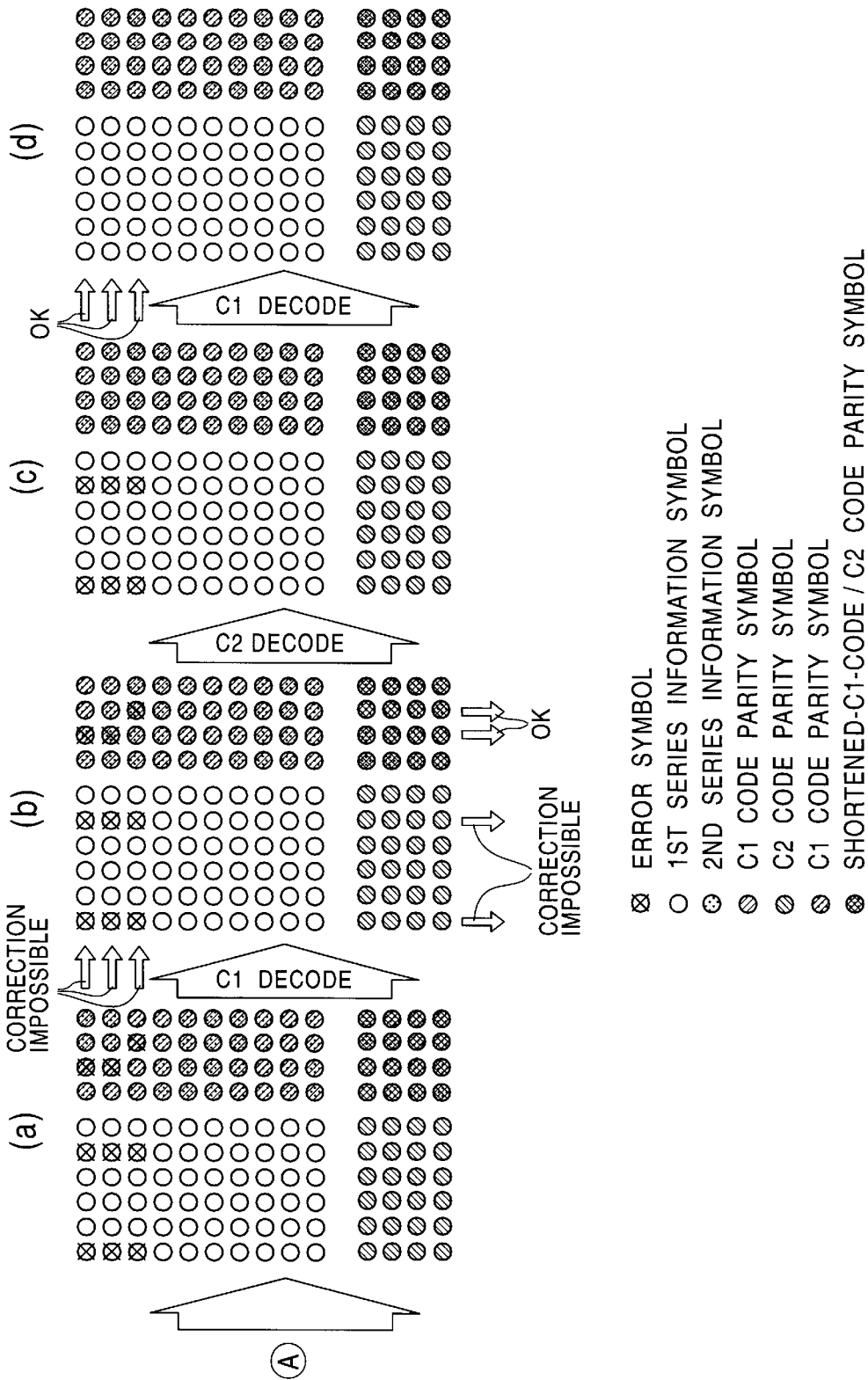
FIG. 13 is an illustration of the process for decoding a pseudo product code by the error correction code decoding unit used in the recording/playback apparatus incorporating the present invention.

Referring now to FIG. 13, the product code shown in Part (a) of FIG. 13 is subjected C1 code decoding performed by the C1 code decoding unit 31, so as to be changed into a product code shown in Part (b) of FIG. 13. This product code is then subjected to C2 code decoding processing performed by the C2 code decoding unit 34, whereby the error symbols in the C1-code parity symbols are corrected, as shown in Part (c) of FIG. 13. The pseudo product code shown in Part (c) of FIG. 13 is further decoded as C1 code by the repetitive decoding unit 36, whereby error symbols in the first-series information symbols are corrected as shown in Part (d) of FIG. 13. Thus, the pseudo product code shown in Part (a) of FIG. 12 is finally transformed into a product code which is free of error symbols.

The described error correction code decoding unit 5 transforms a pseudo product code received from the C1 code decoding unit 31 into a product code, by using the second-series information symbol compensation unit 32 of the type shown in FIG. 5 or FIG. 8. Therefore, error symbols which may be contained in the C1-code parity symbols can be corrected, as the C1-code parity symbols are decoded as C2 codes. Thus, the problem of impossibility of error symbols in the C1-code:parity symbols, which is encountered when the decoding of C2 codes is performed by treating the C1-code parity symbols as being a pseudo product code, can be avoided.

In other words, the described error correction code decoding unit 5 provides such an effect that, when error correction is performed through decoding, the C1-code parity symbols are also decoded as being C2 codes, so that the error correction capability can be improved over the case where the error correction is effected on a pseudo product code.

In the error correction code decoding unit 5 as described above, when an error symbol exists in the second-series information symbols, a pseudo product code shown in FIG. 6 is formed by using the second-series information symbols containing such an error symbol. Consequently, almost all the C1-code parity symbols corresponding to such error symbol also error symbols. A pseudo product code as shown in FIG. 3 containing such error C1-code parity symbols, when used for the subtracting processing, causes an increase in the number of error symbols. For instance, even a single error symbol originally existing in the second-series information symbols produces error symbols of a number corresponding to the number of the C1-code parity symbols. To deal with this problem, the above-described error correction code decoding unit 5 is arranged to reduce the probability of existence of error symbol in the second-series information symbols., by forming the pseudo product code shown in FIG. 6 by means of the second-series information symbol compensation unit 32 and the second-series information symbol extracting unit 39, after the error symbol has been corrected as being a C1 code by means of the C1 code decoding unit 31.

The second-series information symbols of pseudo product code to be handled by the above-described error correction code decoding unit 5 carry address information for correctly locating the C1 code codewords to form a predetermined configuration of the pseudo product code. If any error symbol exists in the second-series information symbols, it becomes impossible to correctly locate the C1 codes that are associated with the error symbol. That is, the symbols of the entire C1 codeword become error symbols. In other words, no increase of the number of error symbols is caused by the subtraction of the pseudo product code of FIG. 6, because the symbols which might be changed into error symbols through the subtraction are already error symbols before the execution of the subtraction. The above-described error correction code decoding unit 5 can suppress increase of the number of error symbols, because it performs error correction on a product code that is obtained through transformation from the pseudo product code with the second-series information symbols carrying the address information for locating the C1 code codeword at proper position of the pseudo product code.

When the second-series information symbol compensation unit 32 of the above-described error correction code decoding unit 5 performs encoding of the second-series information symbols into C1 codes, the first-series information symbols and the C2-code parity symbols are all zero. In such a case, the configuration of the second-series information compensation unit 32 of the type shown in FIG. 8 can suitably be used to calculate the C1-code parity symbols to be added, directly from the second-series information symbols alone.

A description will now be given of a different example of the error correction code decoding unit 5, with specific reference to FIG. 14. Components which are the same as those employed in the error correction code decoding unit 5 of FIG. 4 are denoted by the same reference numerals in FIG. 14, and detailed description is omitted in regard to such components.

Figure 14:
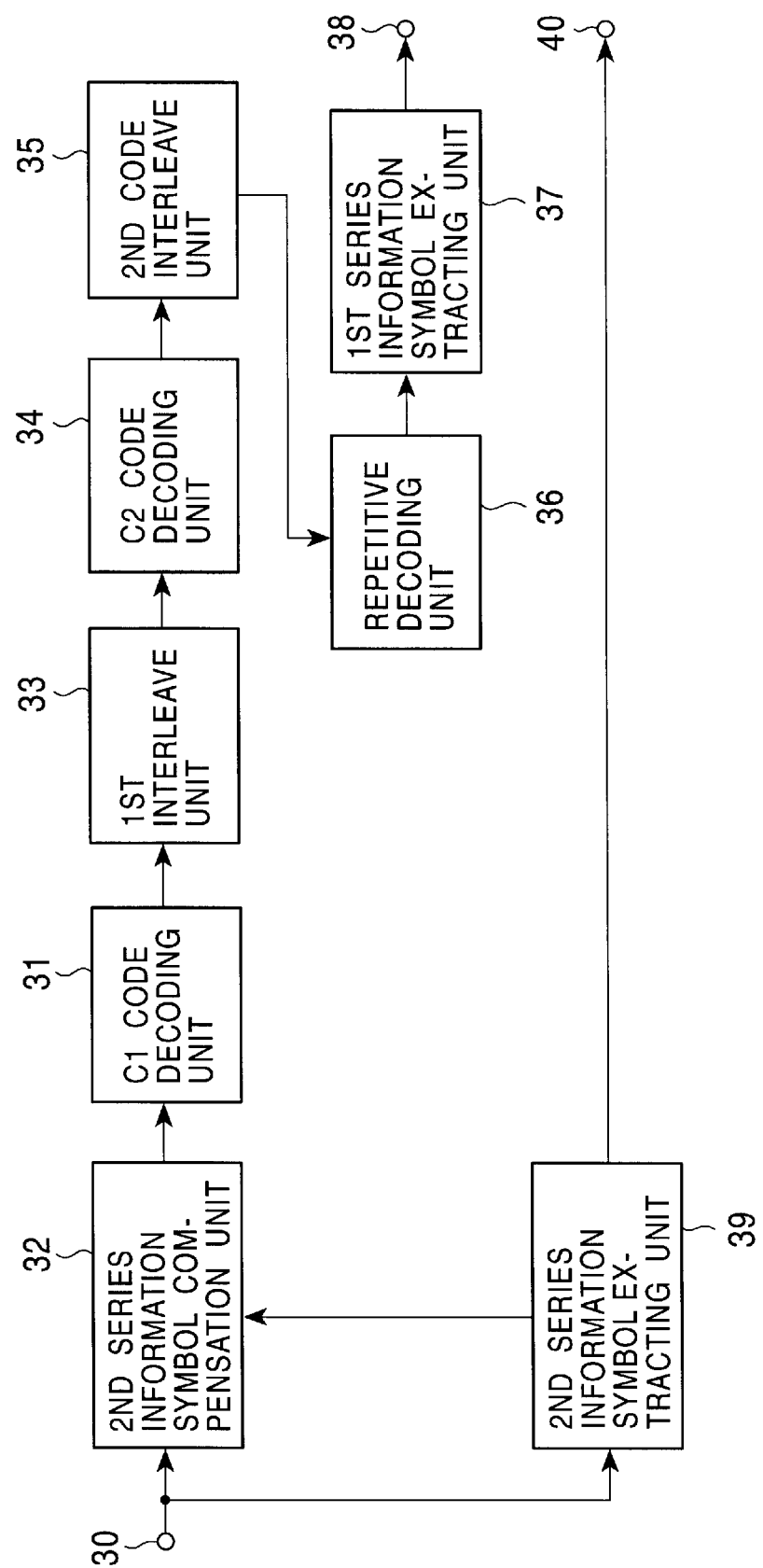
FIG. 14 is a block diagram showing another configuration of the error correction code decoding unit used in the recording/playback apparatus incorporating the present invention.
Figure 15:
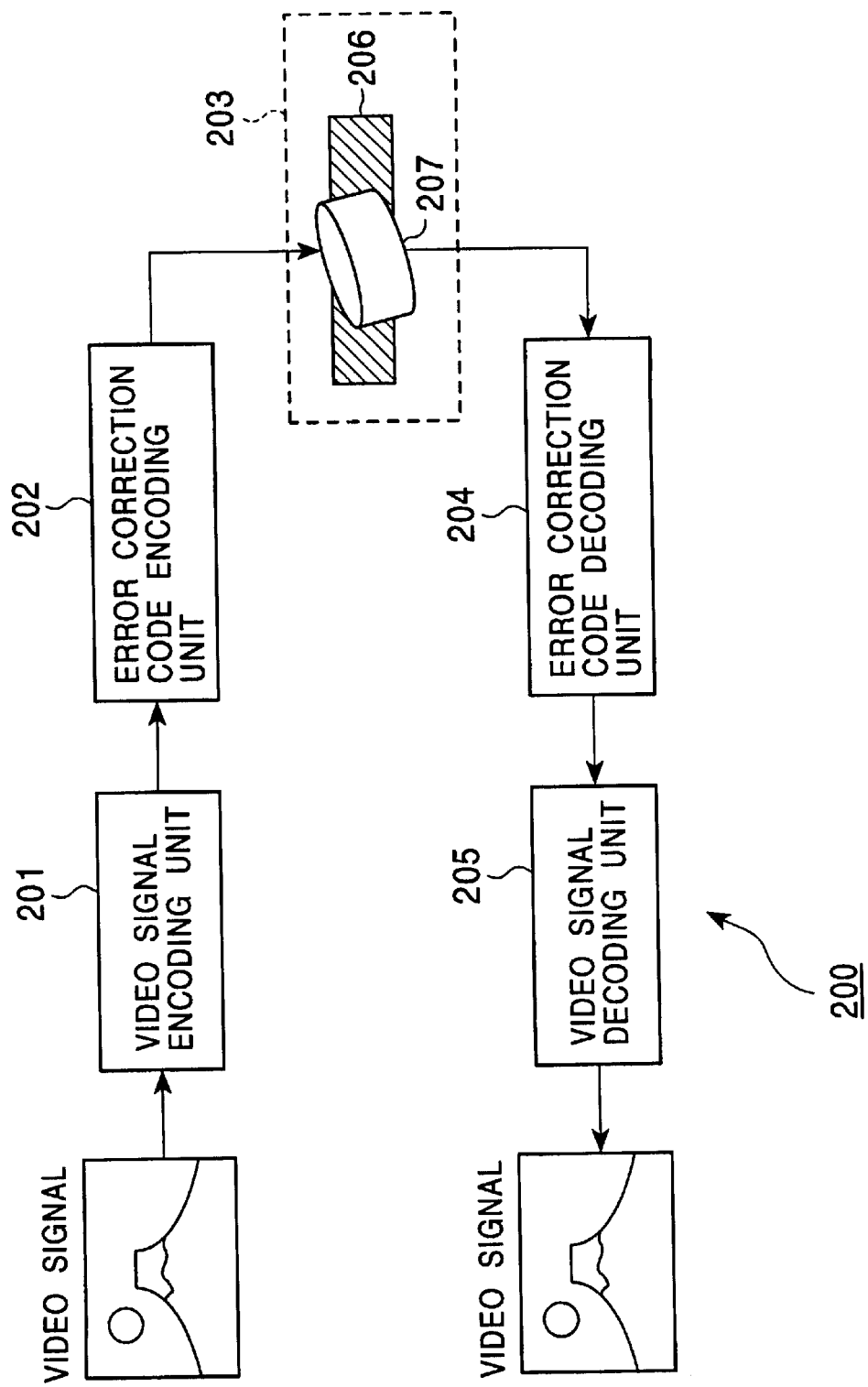
FIG. 15 is an illustration of the configuration of a conventional recording/playback apparatus.
Figure 16:
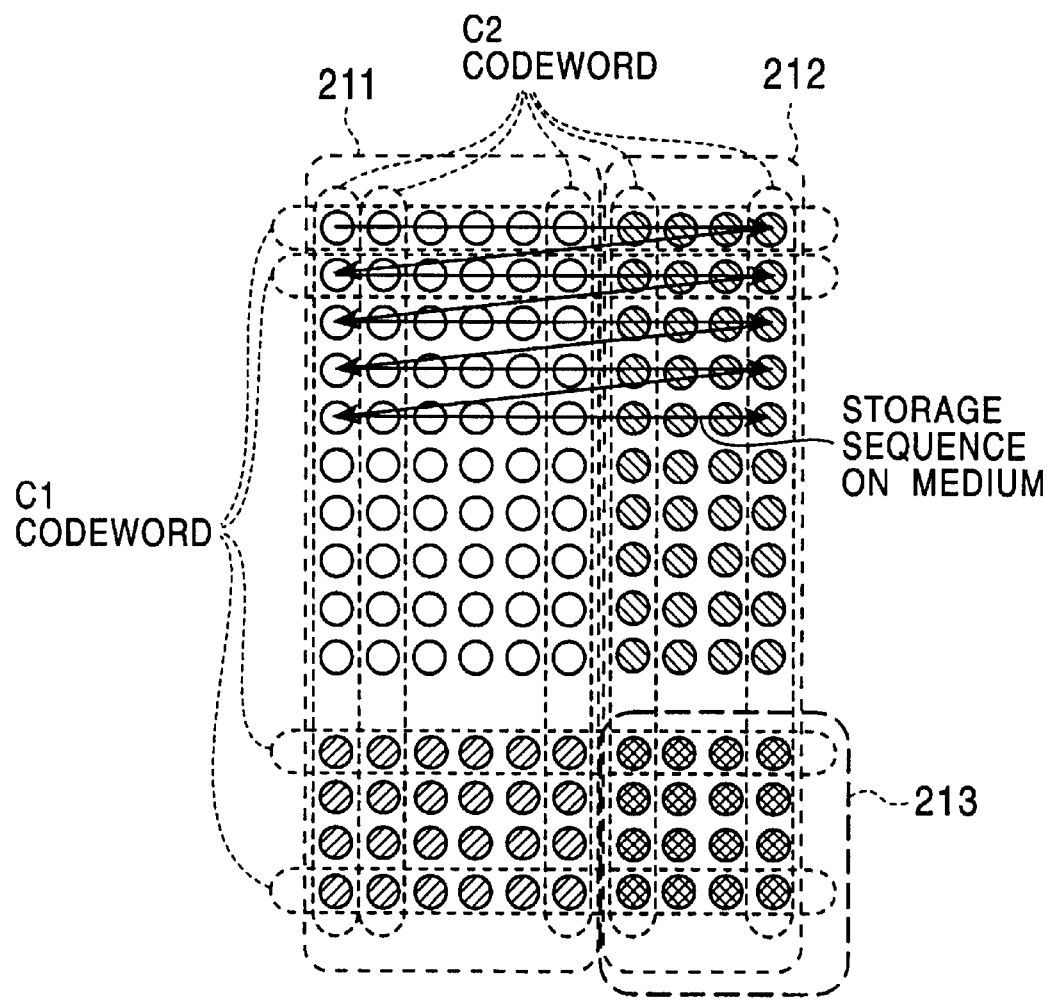
FIG. 16 is an illustration of a product code.
Figure 17:
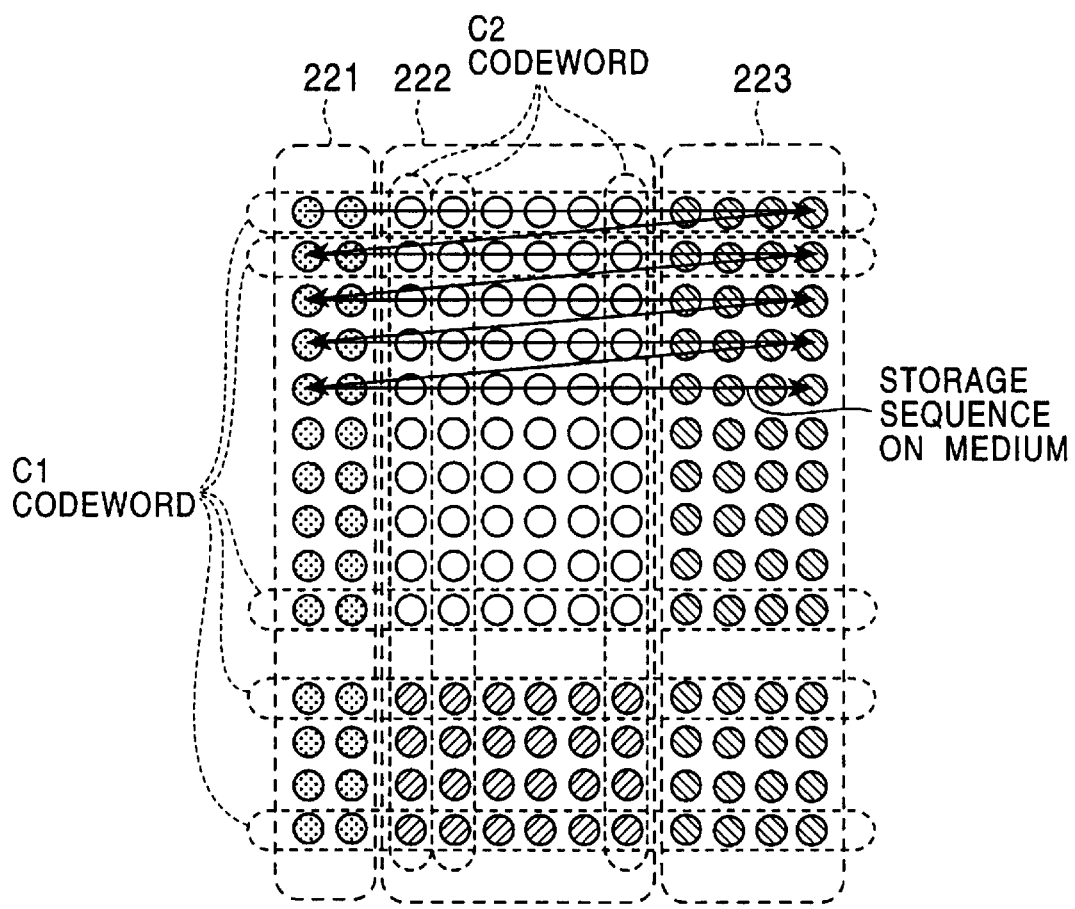
FIG. 17 is an illustration of a pseudo product codeword.
Figure 18:
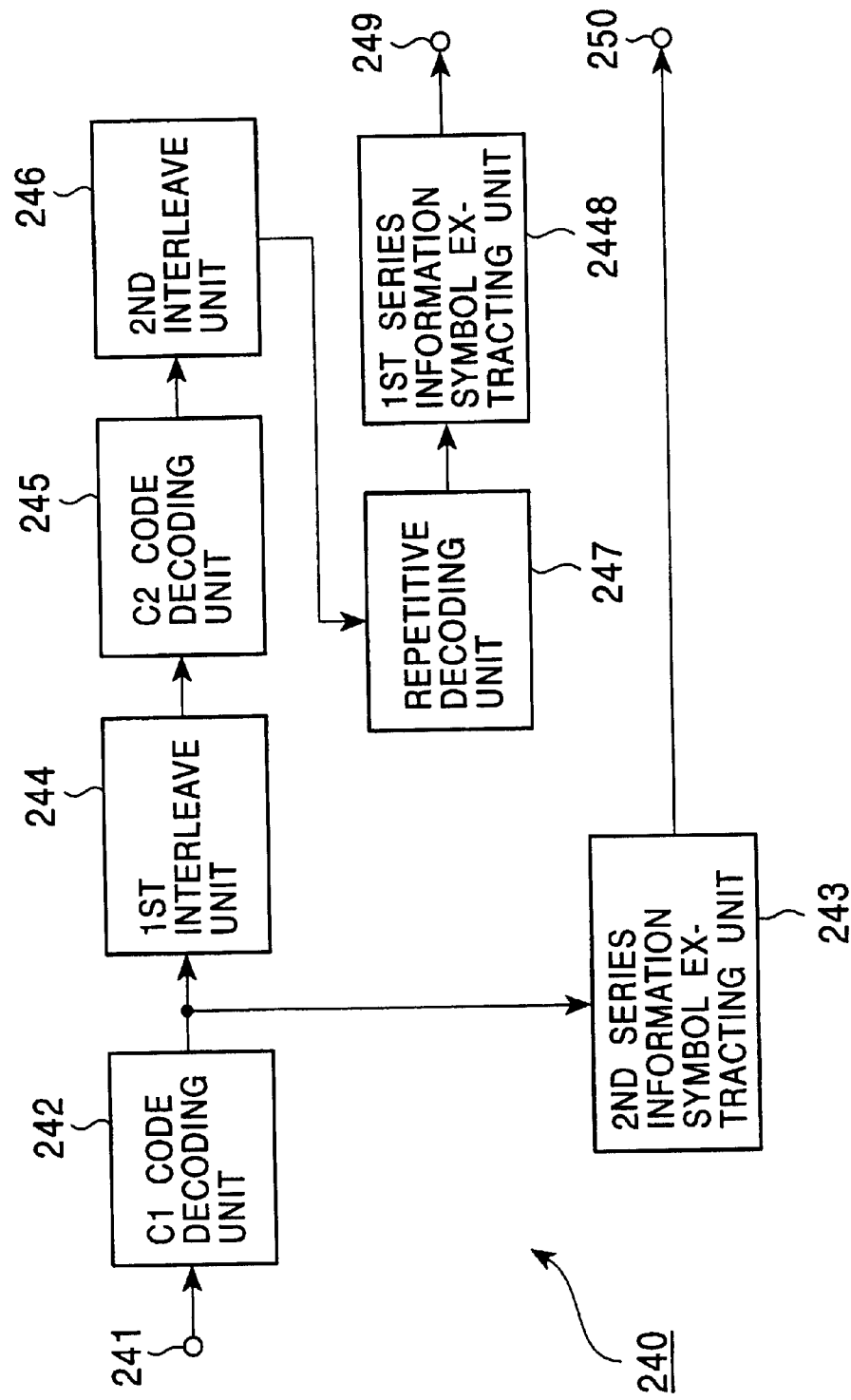
FIG. 18 is a bock diagram showing the configuration of n error correction code decoding unit in the conventional recording/playback apparatus.
Figure 19:
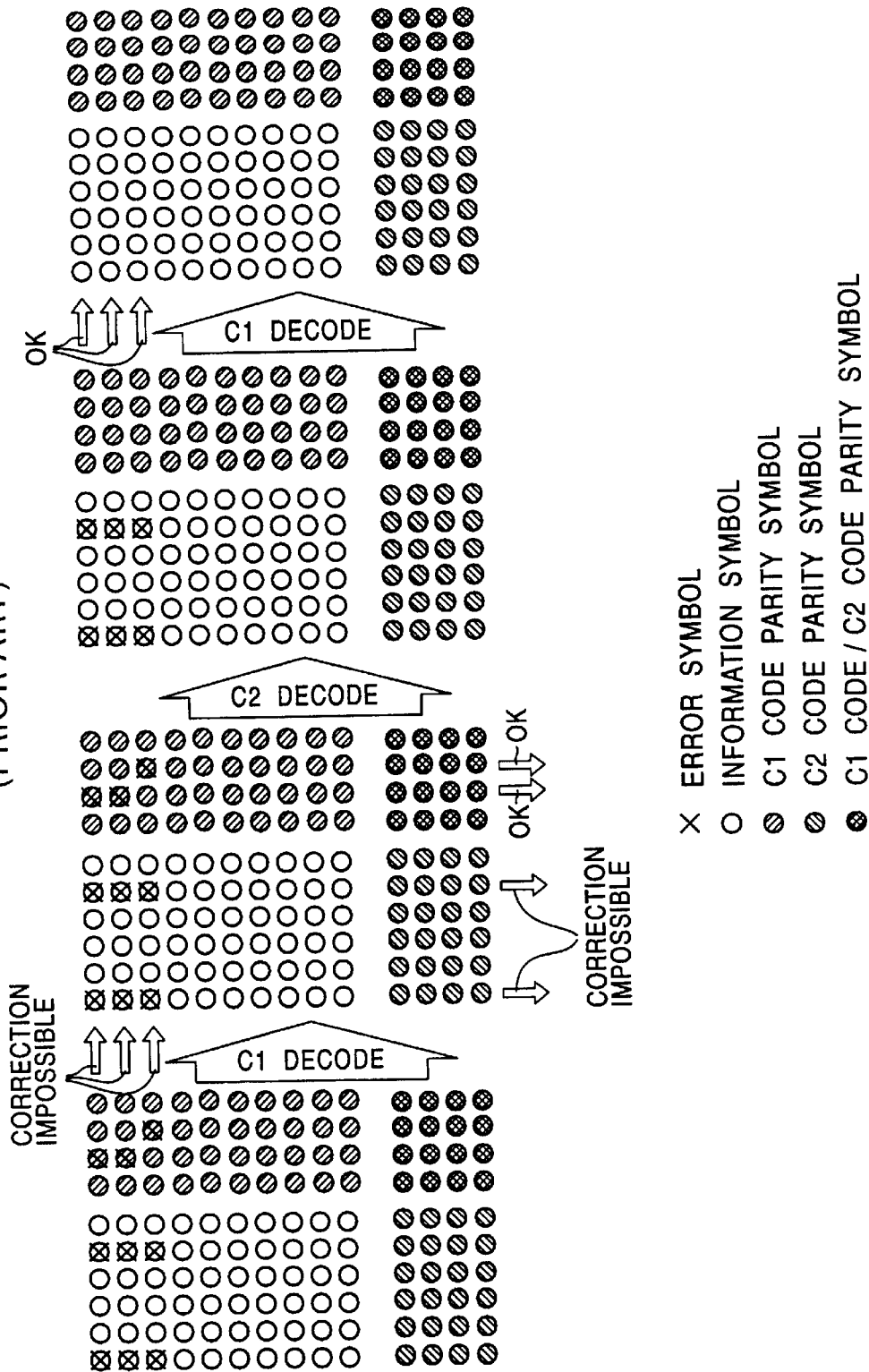
FIG. 19 is an illustration of a process of decoding a product code codeword when the codeword contains errors.
Figure 20:
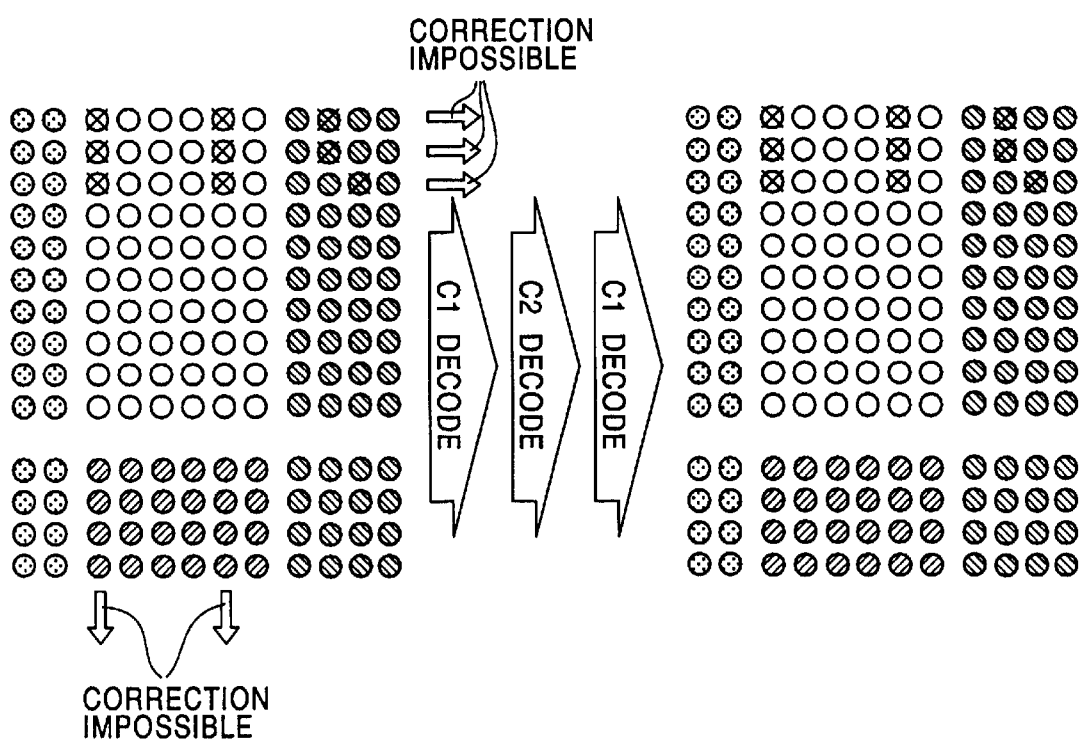
FIG. 20 is an illustration of a process of decoding a pseudo product code codeword performed by a conventional error correction code decoding unit when the pseudo product code codeword contains errors.

Unlike the error correction code decoding unit 5 shown in FIG. 4, the error correction code decoding unit 5 of FIG. 14 is arranged such that a pseudo product code that has been input in the C1-code sequence into the input terminal 30 is delivered both to the second-series information symbol compensation unit 32 and the second-series information symbol extracting unit 39, and such that the output from the second-series information symbol compensation unit 32 is supplied to the C1 code decoding unit 31.

In the error correction code decoding unit 5 of FIG. 14, the pseudo product code received through the input terminal 30 is transformed into a product code, and this product code is supplied to the C1 code decoding unit 31. The output from the C1 code decoding unit 31 undergoes the described processings through the first interleave unit 33, C2 code decoding unit 34, second interleave unit 35, repetitive decoding unit 36 and the first-series information symbol extracting unit 37, whereby a product code with error symbols corrected is output from the output terminal 38.

The error correction code decoding unit 5 of FIG. 14 having the described construction exhibits rather inferior error symbol correcting capability as compared with the error correction code decoding unit 5 of FIG. 4, but provides an advantage in that the C1 code decoding unit 31, first interleave unit 33, C2 code decoding unit 34, second interleave unit 35, repetitive decoding unit 36 and the first-series information symbol extracting unit 37 can be configured as a product code decoding block. In other words, the error correction code decoding unit 5 of FIG. 14 can advantageously be implemented by using a conventional product code decoding device: namely, by arranging the second-series information symbol compensation unit 32 and the second-series information symbol extracting unit 39 to the input side of the above-mentioned product code decoding block.

The error correction code decoding unit 5 of FIG. 4, as well as the error correction code decoding unit 5 of FIG. 14, have similar types of processing blocks, such as the C1 code decoding unit 31 and the C2 code decoding unit 34, the first interleave unit 333 and the second interleave unit 35, and so forth. The processing blocks such as the C1 code decoding unit 31, first interleave unit 33, C2 code decoding unit 34 and the second interleave unit 35 perform processings at high speeds as compared with the speed of input of the pseudo product code through the input terminal 30. The processing blocks therefore can perform the processings in a time-dividing and time-sharing manner. It is thus possible to decode a pseudo product code without incurring substantial enlargement of the scale of the entire apparatus.

As will be understood from the foregoing description, the pseudo product code decoding apparatus and method of the present invention employs: a subtraction code forming processing for forming a subtraction code of a pseudo product code codeword formed of second-series information symbols extracted by a second-series information symbol extracting processing, with the first-series information symbol portion and the second linear-structure error correction code portion having been set to zero codes; a transformation processing for transforming the pseudo product code codeword into a product code codeword by subtracting, from the symbol train constituting the pseudo product code codeword, the subtraction code generated by the subtracting code generating processing; and an error correction code repetitive decoding processing for effecting error correction by executing decoding processings a plurality of times on the symbol train constituting the product code codeword obtained through the transforming processing. Therefore, even if second-series information symbols have been added to a symbol train constituting a product code codeword to form a pseudo product code codeword, errors contained in the first-series information symbols can be corrected through the repetitive decoding processings. In the course of the error correction, first linear-structure error correction code also can be decoded as being an external code. It is therefore possible to achieve an improvement in the error correction capability, as compared with the case where error correcting processing is effected directly on the pseudo product code codeword.

Although the invention has been described through its preferred forms, it is to be understood that the described embodiment and modifications are only illustrative and various changes and further modifications are possible within the scope of the present invention which is limited solely by the appended claims.

What is claimed is:

1. A pseudo product code decoding apparatus, comprising:

first error correction code decoding means for effecting error correction by using parity symbols of a first linear-structure error correction code contained in a symbol train that constitutes a pseudo product code codeword, said pseudo product code codeword being formed by adding, to an array of first-series information symbols, a second linear-structure error correction code regarding external code, and adding thereto second-series information symbols, and adding, to the first-series information symbols with said second linear-structure error correction code and said second-series information symbols added thereto, said first linear-structure error correction code regarding internal code;

second error correction code decoding means for effecting error correction by using parity symbols of said second linear-structure error correction code;

second-series information symbol extracting means for extracting said second-series information symbols from the symbol train constituting said pseudo product code;

subtraction code generating means for generating a subtraction code of a pseudo product code codeword formed of said second-series information symbols extracted by said second-series information symbol extracting means, with the first-series information symbol portion and the second linear-structure error correction code portion being changed to zero codes;

transforming means for subtracting, from said symbol train of said pseudo product code codeword, said subtraction code generated by said subtraction code generating means, thereby transforming said pseudo product code codeword into a product code codeword;

error correction code repetitive decoding means for effecting decoding processings a plurality of times on the symbol train of said product code codeword formed by said transforming means, thereby effecting error correction; and first-series information symbol extracting means for extracting the first-series information symbols from the symbol train constituting the product code codeword obtained by said error correction code repetitive decoding means.

2. A pseudo product code decoding apparatus according to claim 1, further comprising:

first interleave means for rearranging the symbol train which is output from said first error correction code decoding means and which includes symbols arranged in the sequence of said first linear-structure correction code into the sequence of said second linear-structure error correction code, and for delivering the resultant symbol train to said second error correction code decoding means; and second interleave means for rearranging the symbol train which is output from said second error correction code decoding means and which includes symbols arranged in the sequence of said second linear-structure error correction code into the sequence of said first linear-structure error correction code, and for delivering the resultant symbol train to said error correction code repetitive decoding means.

3. A pseudo product code decoding apparatus according to claim 1, wherein said second-series information symbol extracting means extracts the second-series information symbols from the symbol train constituting a pseudo product code codeword output from said first error correction code decoding means.

4. A pseudo product code decoding apparatus according to claim 1, wherein said subtraction code generating means includes:

zero code adding means for adding, to said second-series information symbols from said second-series information symbol extracting means, adding the first-series information symbol portion and the second linear-structure error correction code portion such that these portions become zero codes; and encoding means for encoding the output from said zero code adding means to add the first linear-structure error correction code, thereby forming the subtraction code of pseudo product code codeword.

5. A pseudo product code decoding apparatus according to claim 1, wherein said subtraction code generating means generates the subtraction code with the first linear-structure error correction code added thereto, by encoding said second-series information symbols output from said second-series information symbol extraction means, by treating the first-series information symbol portion and the second linear-structure error correction code portion as being zero codes.

6. A pseudo product code decoding apparatus according to claim 1, wherein said subtraction code generating means generates the subtraction code with the first linear-structure error correction code added thereto, by effecting encoding while treating as being zero codes the first-series information symbol portion and the second linear-structure error correction code portion of the second-series information symbols extracted from the pseudo product code codeword decoded by said first error correction code decoding means.

7. A pseudo product code decoding method, comprising:
a first error correction code decoding step for effecting error correction by using parity symbols of a first linear-structure error correction code contained in a symbol train that constitutes a pseudo product code codeword, said pseudo product code codeword being formed by adding, to an array of first-series information symbols, a second linear-structure error correction-:code regarding external code, adding thereto second-series information symbols, and adding, to the first-series information symbols with said second linear-structure error correction code and said second-series information symbols added thereto, said first linear-structure error correction code regarding internal code;
a second error correction code decoding step for effecting error correction by using parity symbols of said second linear-structure error correction code;
a second-series information symbol extracting step for extracting said second-series information symbols from the symbol train constituting said pseudo product code;
a subtraction code generating step for generating a subtraction code of a pseudo product code codeword formed of said second-series information symbols extracted by said second-series information symbol extracting step, with the first-series information symbol portion and the second linear-structure error correction code portion being changed to zero codes;
a transforming step for subtracting, from said symbol train of said pseudo product code codeword, said subtraction code generated by said subtraction code generating step, thereby transforming said pseudo product code codeword into a product code codeword;
an error correction code repetitive:decoding step for effecting decoding processings a plurality of times on the symbol train of said product code codeword formed by said transforming step, thereby effecting error correction; and
a first-series information symbol extracting step for extracting the first-series information symbols from the symbol train constituting the product code codeword obtained by said error correction code repetitive decoding step.

8. A pseudo product code decoding method according to claim 7, further comprising:
a first interleave step for rearranging the symbol train which is output from said first error correction code decoding step and which includes symbols arranged in the sequence of said first linear-structure correction code into the sequence of said second linear-structure error correction code;
a second interleave step for rearranging the symbol train which is output from said second error correction code decoding step and which includes symbols arranged in the sequence of said second linear-structure error correction code into the sequence of said first linear-structure error correction code; and
executing the second linear-structure error correction code decoding step on the symbol train rearranged by said first interleave step, while executing said error correction code repetitive decoding processing on said symbol train rearranged by said second interleave step.

9. A pseudo product code decoding method according to claim 7, wherein said second-series information symbol extracting step extracts the second-series information symbols from the symbol train constituting a pseudo product code codeword output from said first error correction code decoding step.

10. A pseudo product code decoding method according to claim 7, wherein said subtraction code generating step includes:
zero code adding step for adding, to said second-series information symbols from said second-series information symbol extracting step, adding the first-series information symbol portion and the second linear-structure error correction code portion such that these portions become zero codes; and
encoding step for encoding the output from said zero code adding step to add the first linear-structure error correction code, thereby forming the subtraction code of pseudo product code codeword.

11. A pseudo product code decoding method according to claim 7, wherein said subtraction code generating step generates the subtraction code with the first linear-structure error correction code added thereto, by encoding said second-series information symbols output from said second-series information symbol extraction step, by treating the first-series information symbol portion and the second linear-structure error correction code portion as being zero codes.

12. A pseudo product code decoding method according to claim 7, wherein said subtraction code generating step generates the subtraction code with the first linear-structure error correction code added thereto, by effecting encoding while treating as being zero codes the first-series information symbol portion and the second linear-structure error correction code portion of the second-series information symbols extracted from the pseudo product code codeword decoded by said first error correction code decoding step.

* * * * *